(12) United States Patent
Kawahara et al.

(10) Patent No.: US 11,745,409 B2
(45) Date of Patent: Sep. 5, 2023

(54) STORAGE DEVICE, EJECTION-MATERIAL EJECTION DEVICE, AND IMPRINT APPARATUS

(71) Applicant: CANON KABUSHIKI KAISHA, Tokyo (JP)

(72) Inventors: Nobuto Kawahara, Utsunomiya (JP); Yoshimasa Araki, Yokohama (JP); Yutaka Mita, Utsunomiya (JP); Noriyasu Hasegawa, Utsunomiya (JP); Yuichi Iwasaki, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 578 days.

(21) Appl. No.: 16/838,254

(22) Filed: Apr. 2, 2020

(65) Prior Publication Data
US 2020/0338806 A1    Oct. 29, 2020

(30) Foreign Application Priority Data

Apr. 25, 2019  (JP) .................................. 2019-083710

(51) Int. Cl.
*B29C 59/00*    (2006.01)
*B29C 59/02*    (2006.01)

(52) U.S. Cl.
CPC .......... *B29C 59/002* (2013.01); *B29C 59/026* (2013.01)

(58) Field of Classification Search
None
See application file for complete search history.

(56) References Cited

U.S. PATENT DOCUMENTS

| 9,340,032 | B2 | 5/2016 | Araki et al. | |
| 9,475,303 | B2 | 10/2016 | Araki et al. | |
| 9,834,002 | B2 | 12/2017 | Araki et al. | |
| 10,518,546 | B2 | 12/2019 | Araki et al. | |
| 2015/0097900 | A1* | 4/2015 | Araki | B41J 2/17566 |
| | | | | 264/293 |
| 2018/0001652 | A1* | 1/2018 | Araki | B41J 2/18 |

FOREIGN PATENT DOCUMENTS

| JP | 2008-213349 A | 9/2008 |
| JP | 2015-092549 A | 5/2015 |
| KR | 10-2016-0118941 A | 10/2016 |
| WO | 2019/107383 A1 | 6/2019 |

OTHER PUBLICATIONS

U.S. Appl. No. 16/766,384, filed May 22, 2020.
U.S. Appl. No. 16/880,026, filed May 21, 2020.
Request for the Submission of an Opinion in Korean Application No. 10-2020-0046429 (dated Jul. 19, 2023).

* cited by examiner

*Primary Examiner* — Mohammad M Ameen
(74) *Attorney, Agent, or Firm* — VENABLE LLP

(57) ABSTRACT

A storage device stores an ejection cartridge including an accommodating container that accommodates an ejection material, and an ejection head that includes an ejection port for ejecting the ejection material accommodated in the accommodating container. The storage device includes a mount on which the ejection cartridge is mounted, and includes a pressure regulating tank configured to control a pressure of an inside of the accommodating container of the ejection cartridge fixed to the mount with its ejection port not enclosed.

16 Claims, 16 Drawing Sheets

STORAGE DEVICE, EJECTION-MATERIAL EJECTION DEVICE, AND IMPRINT APPARATUS

BACKGROUND OF THE DISCLOSURE

Field of the Disclosure

The present disclosure relates to a storage device for storing an ejection cartridge, an ejection-material ejection device, and an imprint apparatus.

Description of the Related Art

As an ejection device that ejects liquid or a liquid ejection material accommodated in an accommodating container from an ejection head, Japanese Patent Laid-Open No. 2015-092549 describes a configuration including an accommodating container that is partitioned into two accommodating units by a flexible member. In a case where such an accommodating container is detached from the ejection device and stored or transported, it is required to prevent an ejection material from leaking out of the accommodating container.

Japanese Patent Laid-Open No. 2008-213349 describes a technique relating to transportation and storage of a head for ejecting liquid. Japanese Patent Laid-Open No. 2008-213349 describes a configuration that includes filter openings each having opening areas smaller than those of nozzle openings of the head and in which menisci are formed in the nozzle openings and the filter openings. A holding force of the meniscus formed in each filter opening is not less than that a holding force of the meniscus formed in each nozzle opening, and thus the menisci of the nozzle openings are held, so that leakage of liquid is prevented.

In a process of manufacturing the accommodating container, bubbles can be mixed in the accommodating container and can form entrapped air. In a case where the accommodating container is stored or transported, the accommodating container can pass through an area at high sea level or can be airfreighted. In such a case, there is a possibility that a volume of the entrapped air increases, the ejection material accommodated in the accommodating container is pushed out to break the menisci, bringing about liquid leakage.

SUMMARY OF THE DISCLOSURE

A storage device according to an aspect of the present disclosure is a storage device that stores an ejection cartridge including an accommodating container that accommodates an ejection material, and an ejection head that includes an ejection port for ejecting the ejection material accommodated in the accommodating container, and the storage device includes: a fixing portion configured to fix the ejection cartridge; and a pressure controlling unit configured to control a pressure of an inside of the accommodating container of the ejection cartridge fixed to the fixing portion with the ejection port not enclosed.

Further features of the present disclosure will become apparent from the following description of exemplary embodiments with reference to the attached drawings.

DESCRIPTION OF THE EMBODIMENTS

Embodiments will be described below with reference to the drawings. Note that like reference signs designate the same or identical components. Relative dispositions, shapes, and the like of constituent elements described in the embodiments are merely examples.

Embodiment 1

Embodiment 1 will describe a configuration in which an ejection-material ejection device that ejects an ejection material (hereinafter, referred to simply as "ejection device") includes an ejection cartridge configured to accommodate the ejection material. The ejection cartridge in the present embodiment is configured to be detachably attachable to the ejection device. In addition, the ejection cartridge is configured to be detachably attachable to a storage device for storing the ejection cartridge. The present embodiment will describe mainly about the storage device for storing the ejection cartridge, and prior to the description of the storage device, outlines of an ejection device applicable to the present embodiment and an imprint apparatus using the ejection device will be described. The storage device in the present embodiment will be thereafter described.

<Imprint Apparatus>

Figure 1:
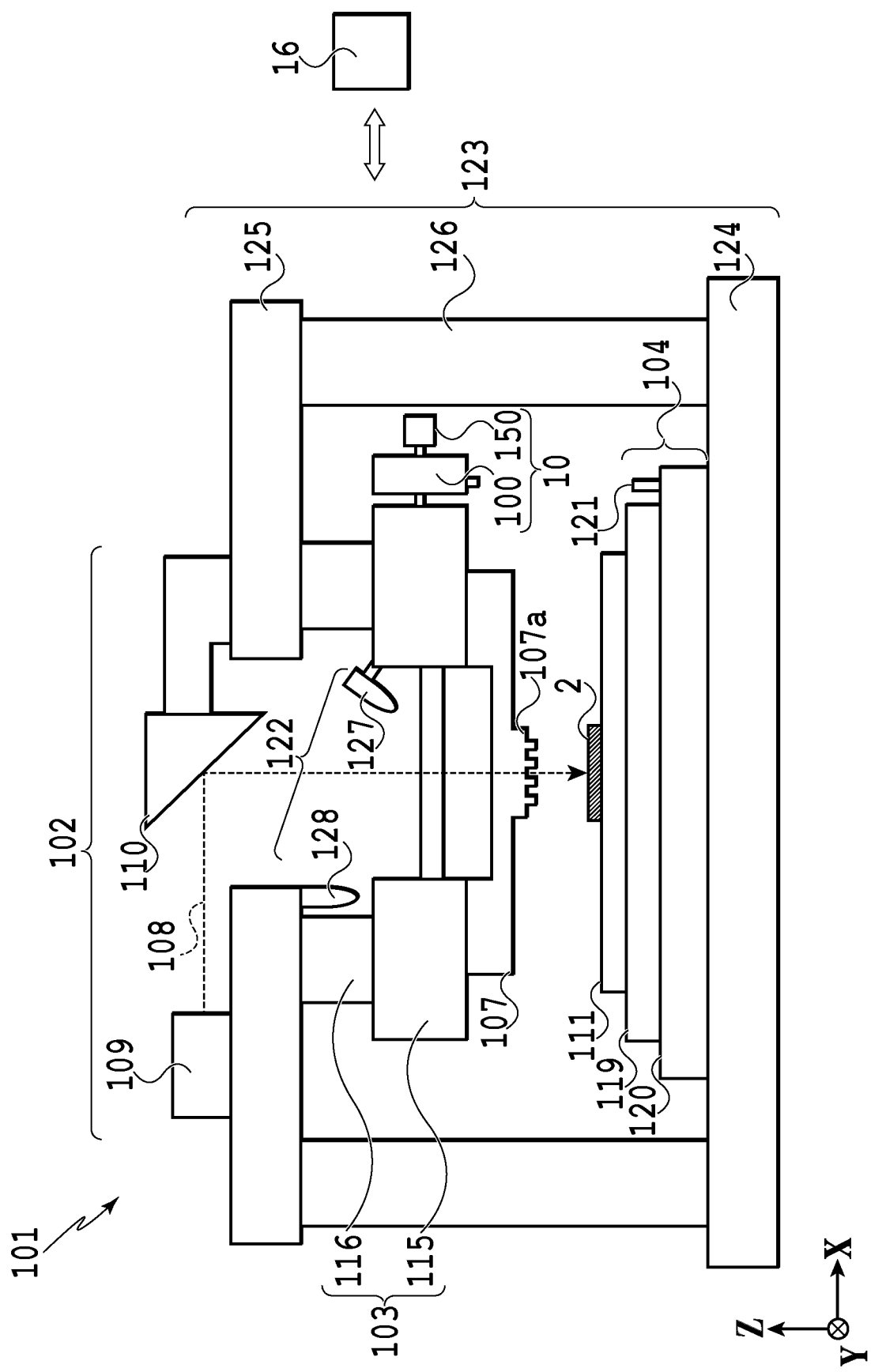
FIG. 1 is a configuration diagram of an imprint apparatus.

FIG. 1 is a schematic view showing a configuration of an imprint apparatus 101 applicable to the present embodiment. The imprint apparatus 101 is used in manufacturing various devices such as semiconductor devices. The imprint apparatus 101 includes an ejection device 10. The ejection device 10 ejects an ejection material 2 (resist) on a substrate 111. The ejection material 2 is a photo-curable resin having a property of curing by receiving ultraviolet rays 108. The ejection material 2 is selected as appropriate under various conditions of a semiconductor device manufacturing process and the like. As the ejection material 2, an ejection material other than the photo-curable one, for example, a heat-curable resist. The imprint apparatus may be an apparatus that causes the resist to cure with heat to perform imprint processing. The ejection material 2 may be called an imprint material.

The imprint apparatus 101 performs the imprint processing that includes the following series of processes. That is, the imprint apparatus 101 causes the ejection device 10 to eject the ejection material 2 onto the substrate 111. Then, a mold 107 having a molding pattern is pressed against the ejection material 2 ejected onto the substrate 111, and in this state, the ejection material 2 is irradiated with light (ultraviolet rays) to cure. Thereafter, the mold 107 is separated from the ejection material 2 after curing, by which the pattern of the mold 107 is transferred onto the substrate 111.

The imprint apparatus 101 includes a light irradiation unit 102, a mold holding mechanism 103, a substrate stage 104, the ejection device 10, a control unit 16, a measurement unit 122, and a housing 123.

The light irradiation unit 102 includes a light source 109 and an optical element 110 that corrects the ultraviolet rays 108 irradiated from the light source 109. The light source 109 is a halogen lamp that generates, for example, i-line or g-line. The ultraviolet rays 108 are irradiated to the ejection material 2 via the mold 107. A wavelength of the ultraviolet rays 108 is a wavelength corresponding to the ejection material 2 to cure. In a case of an imprint apparatus that uses a heat-curable resist as the resist, a heat source unit for curing the heat-curable resist is disposed in place of the light irradiation unit 102.

The mold holding mechanism 103 includes a mold chuck 115 and a mold drive mechanism 116. The mold 107 held by the mold holding mechanism 103 has an outer periphery shape being rectangular and includes a pattern portion 107a on a surface of the mold 107 facing the substrate 111, and on the pattern portion 107a, a three-dimensional concavity and convexity pattern being a circuit pattern to be transferred is formed. A material of the mold 107 in the present embodiment is a material that allows the ultraviolet rays 108 to pass therethrough, and for example, quartz is used as the material.

The mold chuck 115 holds the mold 107 using vacuum adsorption or electrostatic force. The mold drive mechanism 116 moves the mold 107 by moving while holding the mold chuck 115. The mold drive mechanism 116 can move the mold 107 in a −Z direction to press the mold 107 against the ejection material 2. The mold drive mechanism 116 can also move the mold 107 in a Z direction to separate the mold 107 from the ejection material 2. Note that an action of pressing the mold 107 against the ejection material 2 or an action of separating the mold 107 from the ejection material 2 may be implemented by a movement of the substrate stage 104 in the Z direction. Alternatively, the action may be implemented by a relative movement between the mold 107 and the substrate stage 104.

The substrate stage 104 includes a substrate chuck 119, a substrate stage case 120, and a stage reference mark 121. The substrate 111 held by the substrate stage is a single crystal silicon substrate or a silicon-on-insulator (SOI) substrate, and on a surface to be processed of the substrate 111, the ejection material 2 is ejected, and the pattern is formed.

The substrate chuck 119 holds the substrate 111 using vacuum adsorption. The substrate stage case 120 moves the substrate 111 by moving in an X direction and a Y direction while holding the substrate chuck 119 with mechanical means. The stage reference mark 121 is used to set a reference position of the substrate 111 in an alignment between the substrate 111 and the mold 107.

As an actuator for the substrate stage case 120, for example, a linear motor is used. Alternatively, the actuator for the substrate stage case 120 may have a configuration that includes a plurality of driving systems such as a coarse driving system or a fine driving system.

The ejection device 10 includes an ejection cartridge 100, and a pressure control unit 150 that controls a pressure of an inside of the accommodating container of the ejection cartridge 100. The ejection cartridge 100 includes an accommodating container 1 accommodating the ejection material (see FIG. 2) and an ejection head 7 mounted on the accommodating container (see FIG. 2). A configuration of the ejection device 10 will be described below in detail.

The measurement unit 122 includes an alignment measuring device 127 and an observation measuring device 128. The alignment measuring device 127 measures misregistrations in the X direction and the Y direction between an alignment mark formed on the substrate 111 and an alignment mark formed on the mold 107. The observation measuring device 128 is an imaging device such as a CCD camera, takes an image of the pattern of the ejection material 2 ejected onto the substrate 111 and outputs the image as the image information to the control unit 16.

The control unit 16 controls operation and the like of constituent elements of the imprint apparatus 101. The control unit 16 is constituted by, for example, a computer including a CPU, a ROM, and a RAM. The control unit 16 is connected to constituent elements of the imprint apparatus 101 via lines, and the CPU controls the constituent elements in accordance with a control program stored in the ROM.

The control unit 16 controls operation of the mold holding mechanism 103, the substrate stage 104, and the ejection device 10 based on measurement information from the measurement unit 122. Note that the control unit 16 may be formed integrally with another part of the imprint apparatus 101 or may be implemented in a form of another separate apparatus from the imprint apparatus. Alternatively, the control unit 16 may be constituted a plurality of computers rather than one computer.

The housing 123 includes a base surface plate 124 on which the substrate stage 104 is placed, a bridge surface plate 125 that fixes the mold holding mechanism 103, and a support pillar 126 which is extended from the base surface plate 124 and supports the bridge surface plate 125.

The imprint apparatus 101 includes a mold conveyance mechanism (not shown) that conveys the mold 107 into the mold holding mechanism 103 from an outside of the apparatus, and a substrate conveyance mechanism (not shown) that conveys the substrate 111 into the substrate stage 104 from the outside of the apparatus.

<Ejection Device>

Figure 2:
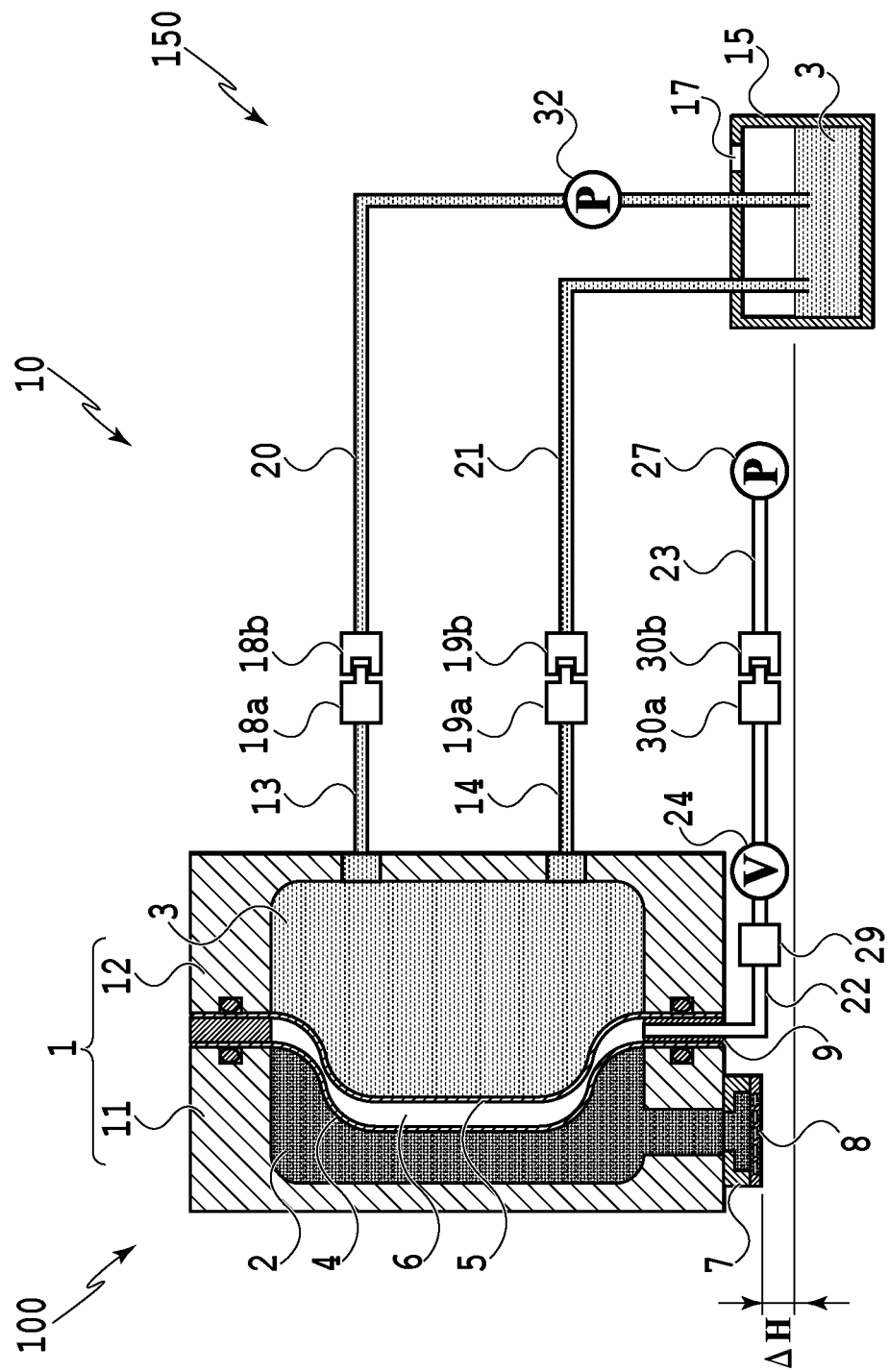
FIG. 2 is a block diagram of an ejection device.

FIG. 2 is a diagram showing an example of the ejection device 10 in the present embodiment. The ejection device 10 includes the ejection cartridge 100, and the pressure control unit 150. The ejection cartridge 100 includes the accommodating container 1 including a housing 11 and a housing 12, the ejection head 7, couplers 18a and 19a detachably attachable to connection pipes 13 and 14, respectively, and a coupler 30a detachably attachable to an inter-film-gap connection pipe 22. An inside of the accommodating container 1 is filled with the ejection material 2. To the ejection device 10, a sub tank 15 is coupled as the pressure control unit 150. An inside of the sub tank 15 is filled with working fluid 3. To the sub tank 15, connection pipes 20 and 21, and couplers 18b and 19b are connected, and coupling between the coupler 18a and the coupler 18b and between the coupler 19a and the coupler 19b allows the inside of the accommodating container 1 and the inside of the sub tank 15 to communicate with each other.

Figure 3:
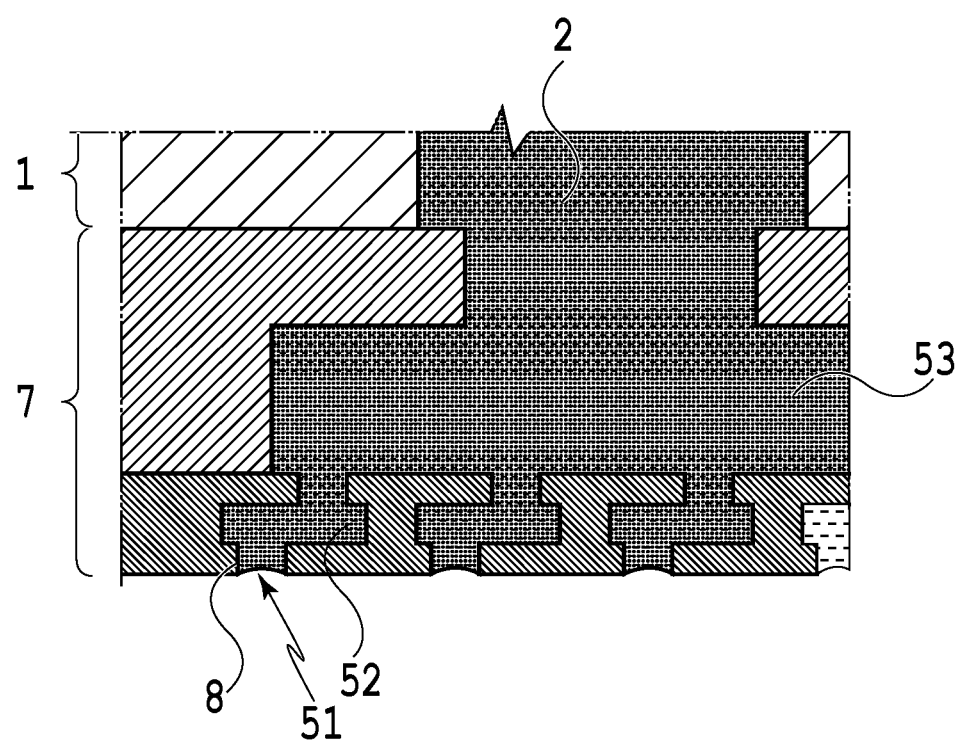
FIG. 3 is an enlarged view of a vicinity of ejection ports in an ejection head.

FIG. 3 is an enlarged view of a vicinity of ejection ports 8 in the ejection head 7. The ejection head 7 includes pressure chambers 52 that are provided correspondingly to the ejection ports 8, and in each of the pressure chambers 52, ejection mechanisms are arranged with a density ranging from 500 to 1000 per inch. The ejection mechanisms are each constituted by, for example, a piezoelectric element or a heating element (not shown), in which energy such as pressure, vibration and heat is added to the ejection material 2, so as to eject the ejection material 2 from the ejection port 8. The ejection mechanism may be any ejection mechanism capable of generating energy that can eject the ejection material in a form of a fine droplet, for example, a droplet having a volume of 1 pL or the like.

Each pressure chamber 52 communicates with a common liquid chamber 53, and the common liquid chamber 53 communicates with a liquid chamber that is filled with the ejection material 2 in the accommodating container 1. Ejection materials to be ejected from the ejection ports 8 are supplied from the accommodating container 1 to the pressure chambers 52 via the common liquid chamber 53. The ejection head 7 includes no control valve between the ejection head 7 and the accommodating container 1. Therefore, an internal pressure of the accommodating container 1 is controlled such that the internal pressure becomes a negative pressure slightly lower than an atmospheric pressure of an outside of the ejection ports 8 of the ejection head 7 (ambient air pressure). This negative pressure control causes the ejection materials in the ejection ports 8 to form menisci 51 on interfaces between the ejection materials and the ambient air, which prevent the ejection materials from leaking out (dropping) from the ejection ports at an unintended timing. In the present example, the internal pressure of the accommodating container 1 is controlled to be a negative pressure that is lower than the ambient air pressure by 0.40±0.04 kPa. By setting the pressure of the accommodating container 1 to be a negative pressure with respect to the atmospheric pressure, the menisci are made to have concave portions having larger depths, which make it difficult for shapes of the menisci to collapse.

Returning to FIG. 2, the description of the ejection device 10 will be continued. The inside of the accommodating container 1 is formed as an enclosed space that is partitioned by an ejection-material-side film 4 and a working-fluid-side film 5, and two partitioned liquid chambers are filled with the ejection material 2 and the working fluid 3, respectively. The ejection-material-side film 4 and the working-fluid-side film 5 are flexible members, and the ejection-material-side film 4 and the working-fluid-side film 5 each form a flexible partition member. The liquid chamber filled with the ejection material 2 will be referred to as a first liquid chamber, and the liquid chamber filled with the working fluid 3 will be referred to as a second liquid chamber. The working fluid is a substance having such an incompressible property that changes of the working fluid in density (volume) by external temperature and pressure are negligibly small as compared with those of gases. Therefore, the volume of the working fluid 3 scarcely changes as an ambient temperature or an ambient pressure of the ejection device 10 change. As the working fluid 3, a substance selected from, for example, a liquid such as water, and a gel-like substance can be used. In general, a difference in density between the ejection material and the working fluid is smaller than a difference in density between the ejection material and a gas.

In a middle of a flow passage of the connection pipe 20 coupling the accommodating container 1 and the sub tank 15, a pump 32 is provided, forming a configuration that can circulate the working fluid 3 via two lines of pipes coupling the accommodating container 1 and the sub tank 15. By circulating the working fluid 3 in the pipe coupling the accommodating container 1 and the sub tank 15, bubbles inside the connection pipes 13 and 14, and the connection pipes 20 and 21 are also circulated with the working fluid 3, enabling removal of the bubbles.

The accommodating container 1 includes the first liquid chamber (first accommodating space) filled with the ejection material 2 and the second liquid chamber (second accommodating space) filled with the working fluid 3. In the present embodiment, the ejection-material-side film 4 and the working-fluid-side film 5 are configured to be movable together, which will be described below. For that reason, in a case where a difference in internal pressure between the first accommodating space and the second accommodating space occurs, the ejection-material-side film 4 and the working-fluid-side film 5 both having flexibility moves together toward a side of a lower inner pressure and stop the movement when the difference in internal pressure is dissolved, and the ejection-material-side film 4 and the working-fluid-side film 5 repeat the movement and the stop. This can keep the internal pressures of the first accommodating space and the second accommodating space to be equal to each other. The space in which the working fluid 3 is accommodated communicates with the inside of the sub tank 15, and a surface of the liquid in the sub tank 15 is set to be at a position lower than an ejection surface of the ejection head 7. For that reason, the ejection material 2 does not leak out of the ejection head 7.

Now, this will be described more specifically. In a case where the ejection material 2 is ejected from the ejection head 7, an inner volume of the ejection material in the first accommodating space is reduced by the ejected ejection material, which decreases the internal pressure of the first accommodating space. At that time, the internal pressure of the second accommodating space becomes relatively higher than the internal pressure of the first accommodating space. The ejection-material-side film 4 and the working-fluid-side film 5 that are flexible are joined by a joint portion not shown, or a negative pressure generating unit 27 described below, so as to be able to move together, and thus the ejection-material-side film 4 and the working-fluid-side film 5 moves together toward the first accommodating space filled with the ejection material 2. At the same time, the working fluid 3 is drawn up into the second accommodating space from the sub tank 15 through the connection pipe 14. This equalizes the internal pressures of the first accommodating space and the second accommodating space in the accommodating container 1 again, bringing them into an equilibrated state.

As shown in FIG. 2, the sub tank 15 communicates with an external space via an air communication port 17, and thus an internal pressure of the sub tank 15 is equal to the atmospheric pressure. The connection pipe 14 that causes the inside of the sub tank 15 to communicate with the second accommodating space is filled with the working fluid 3, a liquid level position of the working fluid 3 inside the sub tank 15 in a vertical direction (hereinafter, referred to also as "liquid surface height") is set at a position lower than the ejection ports 8 of the ejection head 7. Let ΔH define a difference in height (distance in the vertical direction) between the liquid level position of the working fluid 3 in the sub tank 15 and a position of the ejection surface in openings of the ejection ports 8. In the present embodiment, the difference ΔH is set in such a manner as to maintain a state in which the menisci 51 of the ejection materials are formed in the ejection ports 8 (state shown in FIG. 3). That is, the difference ΔH is specified in such a manner that the ejection materials do not leak out or drop from the ejection ports 8 or that the menisci 51 do not retract into a deep recess excessively (e.g., into a vicinity of the common liquid chamber). Specifically, the difference in height ΔH is set at 41±4 mm in such a manner that the internal pressure of the first accommodating space is controlled to have a value lower than that of the ambient air pressure by 0.40±0.04 kPa. Note that the difference in height ΔH is set in accordance with a diameter of the ejection ports 8 and physical properties of the ejection material (e.g., density, viscosity, etc.), as appropriate. In such a manner, the accommodating container 1 is configured so that the pressure of the inside of the accommodating container 1 can be controlled.

In a case where the ejection device 10 performs an ejection operation, the ejection material is consumed as a matter of course. In a case where the ejection material 2 in the ejection cartridge 100 is consumed, the working fluid 3 is drawn up from the sub tank 15 by a volume of the consumption, and the surface of the liquid in the sub tank 15 descends. In a case where the surface of the liquid in the sub tank 15 descends, the difference of potential head ΔH increases, and the internal pressure of the accommodating container 1 becomes an excessively negative pressure, which consequently causes the ambient air to be drawn from the ejection ports 8. To prevent such a situation, the ejection device 10 shown in FIG. 2 measures the surface of the liquid in the sub tank 15 with a liquid-level gauge not shown, and in a case where the surface of the liquid excessively falls, the ejection device 10 performs a sequence of replenishing the sub tank 15 with the working fluid using a pump from a main tank not shown.

The connection pipe 13 coupling the accommodating container 1 and the sub tank 15 is configured to be separable from the connection pipe 20 by the coupler 18a and the coupler 18b. The connection pipe 14 is configured to be separable from the connection pipe 21 by the coupler 19a and the coupler 19b. The couplers 18a, 18b, 19a, and 19b each have a mechanism (not shown) that brings them into a sealed state when they are separated, and the mechanism prevents liquid leakage.

Between the working-fluid-side film 5 and the ejection-material-side film 4, a film-to-film-gap plate 9 is provided. The film-to-film-gap plate 9 is provided with a through hole portion that communicates with an inter-film gap 6 and to which the inter-film-gap connection pipe 22 is connected in a communicating state. To the inter-film-gap connection pipe 22, a liquid leakage sensor 29 and the negative pressure generating unit 27 are connected. The inter-film-gap connection pipe 22 is connected to the negative pressure generating unit 27 by a communicating pipe 23. In a middle of the communicating pipe 23, an open-close valve 24 is connected. As the negative pressure generating unit 27, a vacuum pump for drawing and discharging gas, a vacuum ejector (using compressed air), or the like is used. The negative pressure generating unit 27 draws gas (air) inside the inter-film gap 6 (a gap between the flexible partition members) to maintain the inside of the inter-film gap 6 in a negative pressure state where a pressure of the inside of the inter-film gap 6 is lower than the internal pressures of the first accommodating space and the second accommodating space in the accommodating container 1. This can bring at least portions of the working-fluid-side film 5 and the ejection-material-side film 4 into intimate contact with each other. By bringing at least the portions of the working-fluid-side film 5 and the ejection-material-side film 4 into intimate contact with each other, the working-fluid-side film 5 and the ejection-material-side film 4 can move together while deforming together in an interlocked manner. In a case where at least one of the ejection-material-side film 4 and the working-fluid-side film 5 is broken to form a hole, the ejection material 2 or the working fluid 3 flows into the inter-film-gap connection pipe 22, and the liquid leakage can be detected by the liquid leakage sensor 29.

The inter-film-gap connection pipe 22 and the communicating pipe 23 that couple the accommodating container 1 and the negative pressure generating unit 27 are configured to be separable from each other by the coupler 30a and a coupler 30b. The coupler 30a and the coupler 30b each have a mechanism (not shown) that brings them into a sealed state when they are separated.

<Storage Device>

Next, a storage device (storage container) in the present embodiment will be described. The storage device is a device (container) that stores the ejection cartridge 100. As shown in FIG. 2, the ejection cartridge 100 in the present embodiment is detachably attachable by the couplers.

Here, in a case where the couplers are separated, bubbles may be contained in accommodating container 1 of the ejection cartridge 100. In a case where the ejection cartridge 100 with the bubbles contained is stored or transported, the ejection cartridge 100 can pass through a region at high sea level or can be airfreighted. In this case, there is a possibility that volumes of the bubbles increase, pushing the ejection material 2 from the ejection ports 8, resulting in an occurrence of the liquid leakage.

It is conceivable to prevent the liquid leakage by covering the ejection head 7 with a cap member with protrusions so as to hermetically seal the ejection ports 8 of the ejection head 7. However, as mentioned above, the ejection head 7 in the present embodiment includes the ejection ports 8, which are formed with a density ranging from about 500 to 1000 per inch and have an extremely small diameter ranging from several μm to several tens of μm. It is difficult to fabricate, for example, the cap with protrusions to hermetically seal the ejection ports 8 by exactly aligning positions of the protrusions with the ejection ports 8.

Moreover, in the imprint apparatus 101 applicable to the present embodiment, a photo-curable resist (photosensitive resist) is used as the ejection material, as mentioned above. In a semiconductor manufacturing process in which the photosensitive resist is used, if particles (dust) of a several-nm size are contained in, the photosensitive resist is not applied on the substrate 111 in a desired state. In addition, no metal ions are allowed to be eluted into the photosensitive resist. Therefore, components to come into contact with the ejection ports 8 are required to be a material that substantially does not wear down nor allow metal ions to be eluted. Also for this reason, it is difficult to fabricate, for example, the cap member with protrusions to hermetically seal the ejection ports 8 of the ejection head 7. In a case where PTFE, which raises little concern about metal elusion, is used as the cap member, the cap member fails to provide a sufficient enclosing effect due to a lack of flexibility of the material.

In view of the matters described above, a configuration of the storage device that restrains the leakage of the ejection material 2 with which the accommodating container 1 in the ejection cartridge 100 is filled will be described below. In the present embodiment, the storage device includes a pressure controlling unit that controls the pressure of the inside of the accommodating container 1, and with the pressure controlling unit, the storage device restrains the leakage of the ejection material 2 with which the accommodating container 1 is filled.

Figure 4:
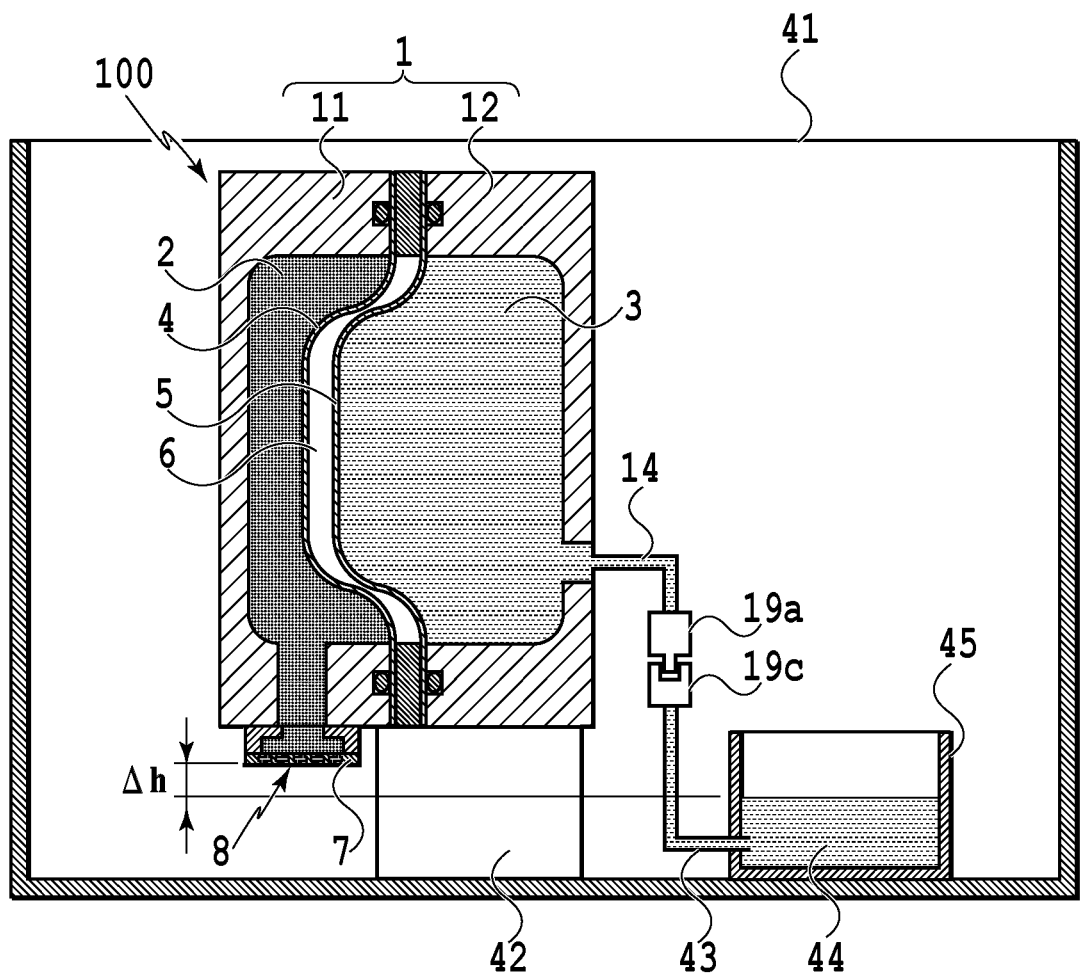
FIG. 4 is a diagram showing an example of a storage device.

FIG. 4 is a diagram showing an example of a storage device 41 in the present embodiment. The storage device 41 includes a mount 42 configured to allow the ejection cartridge 100 to be mounted on the mount 42 at a predetermined height in the vertical direction. The mount 42 and the ejection cartridge 100 are fixed by a fixing mechanism not shown. The ejection cartridge 100 includes the ejection head 7, the connection pipe 14, and the coupler 19a, and the inside of the accommodating container 1 is filled with the ejection material 2. Note that, in addition to the connection pipe 14, the ejection cartridge 100 is connected to the connection pipe 13 and the inter-film-gap connection pipe 22 as described with reference to FIG. 2, but FIG. 4 shown a simplified diagram for ease of illustration.

In the storage device 41, a pressure regulating tank 45 is additionally disposed as a pressure controlling unit. The pressure regulating tank 45 is referred to also as a second accommodating container. An inside of the pressure regulating tank 45 is filled with pressure regulating fluid 44 that is of the same kind as the working fluid 3 with which the inside of the accommodating container 1 is filled.

To the pressure regulating tank 45, a connection pipe 43 and a coupler 19c are connected. The connection pipe 43 is a pipe connectable to a communication portion that communicates with the inside of the accommodating container 1. By coupling the coupler 19a and the coupler 19c, the inside of the accommodating container 1 and the inside of the pressure regulating tank 45 communicate with each other. The pressure regulating tank 45 is opened to the atmosphere, and the inside of the pressure regulating tank 45 is filled with the pressure regulating fluid 44, a liquid surface of which is adjusted to be at a position that is lower than the ejection surface of the ejection head 7 by $\Delta h$.

At that point, the internal pressure of the ejection material in the accommodating container 1 has a value lower than the atmospheric pressure by a difference of potential head of $\Delta h$, and thus the ejection materials do not leak out of the ejection ports 8 formed in the ejection head 7. This is the same phenomenon as that in the description about the ejection device 10 with the sub tank 15. As seen from the above, the storage device 41 in the present embodiment includes the pressure regulating tank 45 as an alternative member of the sub tank 15 of the pressure control unit 150 in the description about the ejection device 10.

The storage device 41 is used for containing the ejection cartridge 100 mainly in a case where the ejection cartridge 100 is stored or transported. That is, while being contained in the storage device 41, the ejection cartridge 100 is not caused to eject the ejection material 2. For that reason, it is not assumed that the ejection material 2 is consumed in the storage device 41. It is therefore not assumed that the pressure regulating fluid 44 inside the pressure regulating tank is drawn up into the accommodating container 1. This enables a configuration including no mechanism (main tank, pump) for replenishing the working fluid 3.

Figure 5A:
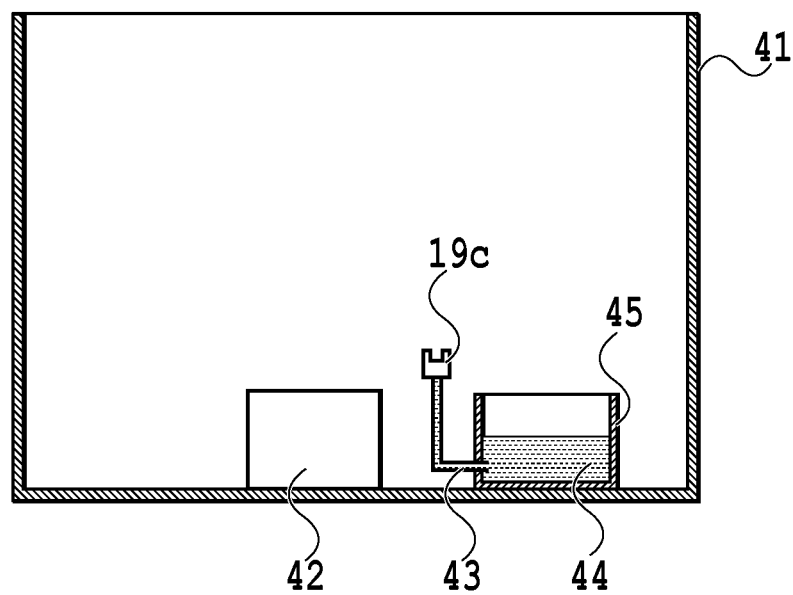
FIG. 5A and FIG. 5B are diagrams each used for describing how an ejection cartridge is accommodated in the storage device.
Figure 5B:
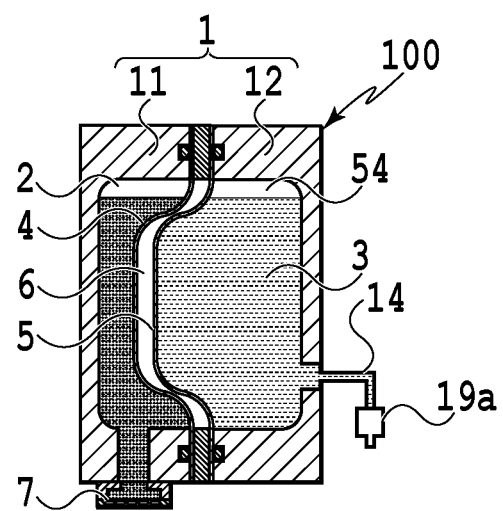

FIG. 4 shows a state in which the ejection cartridge 100 has been accommodated in the storage device 41. With reference to FIG. 5A and FIG. 5B, how the ejection cartridge 100 is stored and transported being accommodated in the storage device 41 will be described. FIG. 5A is a diagram showing the storage device 41 shown in FIG. 4. FIG. 5A shows a state where the ejection cartridge 100 is not accommodated in the storage device 41. FIG. 5B shows the ejection cartridge 100 being detached from the ejection device 10. For storing or accommodating the ejection cartridge 100, the coupler 19a and the coupler 19b are separated from each other to be brought into a state shown in FIG. 5B before the ejection cartridge 100 is accommodated in the storage device 41 (this holds for other couplers, and the description for the other couplers will not be described. This holds true for the present embodiment.). As mentioned above, the coupler 19a is prevented from causing the liquid leakage by the enclosing mechanism not shown. However, in a case where the coupler 19a is attached or detached, although its amount is small, air may be contained in the connection pipe 14. In a case where the attachment and detachment of the coupler 19a are repeated, the air contained in the connection pipe 14 moves into the accommodating container, forming an air layer 54. If the ejection cartridge 100 passes through a high altitude area or is airfreighted in this state in a middle of its transportation, the pressure of the inside of the accommodating container 1 becomes higher than the ambient air pressure, which makes it difficult to maintain the menisci 51.

As mentioned above, the ejection device 10 controls the difference $\Delta H$ in height between the liquid level position of the working fluid 3 in the sub tank 15 and the position of the ejection surface in the openings of the ejection ports 8 in such a manner that the difference $\Delta H$ ranges 41±4 mm. At that point, the pressure of the inside of the accommodating container 1 is lower than the pressure of the ambient air by 0.40±0.04 kPa. As a matter of course, the pressure of the air layer 54 is also lower than the pressure of the ambient air by 0.40±0.04 kPa, and the accommodating container 1 is balanced in pressure. Even in a case where the ejection cartridge 100 is brought into the state shown in FIG. 5B from the state where the ejection cartridge 100 is attached to the ejection device 10 by separating the coupler 19a, the pressure of the inside of the accommodating container 1 is maintained lower than the pressure of the ambient air by 0.40±0.04 kPa since the coupler 19a includes the enclosing mechanism. For example, assuming that an absolute pressure of the ambient air is 101.3 kPa, the pressure of the inside of the accommodating container 1 is 100.9 kPa. That is, even in a case where the air layer 54 is formed, there is no possibility of the leakage of the ejection material 2 as long as the ejection cartridge 100 is attached and fixed to the ejection device 10.

In a case where the ejection cartridge 100 is transported with the air layer 54 formed, the ambient air pressure may become not more than 99.0 kPa. In this case, without the storage device 41, the pressure of the inside of the accommodating container becomes higher than ambient air pressure by 1.9 kPa or larger, which makes it difficult to maintain the menisci 51 described with reference to FIG. 3. In addition, a volume of the air layer 54 described with reference to FIG. 5B increases in inverse proportion to the ambient air pressure, which pushes the ejection materials 2 from the ejection ports 8.

In contrast to this, the storage device 41 in the present embodiment includes a configuration that provides a predetermined difference of potential head, as shown in FIG. 4. That is, in a state where the ejection cartridge 100 shown in FIG. 5B is accommodated in the storage device 41 shown in FIG. 5A, the difference of potential head $\Delta h$ is provided between the ejection ports 8 of the ejection head 7 and the pressure regulating fluid 44 in the pressure regulating tank 45. In the present embodiment, the difference of potential head $\Delta h$ shown in FIG. 4 is controlled to range 41±4 mm.

In a case where the ejection cartridge 100 is accommodated in the storage device 41 in the present embodiment, as mentioned above, the working fluid 3 in the accommodating container 1 and the pressure regulating fluid 44 in the pressure regulating tank 45 are caused to have the same pressure by coupling the coupler 19a and the coupler 19c to cause the accommodating container 1 and the pressure regulating tank 45 to communicate with each other. In addition, since the ejection-material-side film 4 and the working-fluid-side film 5 move together as mentioned above, the liquid chamber accommodating the ejection material 2 and the liquid chamber accommodating the working fluid 3 in the accommodating container 1 have the same pressure. Moreover, the pressure regulating tank 45 is opened to the atmosphere. Therefore, even in a case where the ambient pressure drops, the pressure of the ejection material 2 becomes a negative pressure that is lower than the ambient pressure by the difference of potential head Δh. That is, the pressure of the inside of the accommodating container 1 does not become higher than the ambient air pressure.

In the state shown in FIG. 4, even in a case where a drop in the pressure of the ambient air increases the volume of the air layer 54 shown in FIG. 5B, the working fluid 3 first flows out of the accommodating container 1 toward the pressure regulating tank 45, keeping the balance in pressure in the accommodating container 1. This prevents the ejection material 2 from leaking out from the ejection head 7.

Since the ejection cartridge 100 applicable to the imprint apparatus 101 is used for the photosensitive resist as the ejection material 2, containing of particles and metal ions is strictly restricted, which has been described earlier. In the storage device 41 in the present embodiment, the pressure regulating tank 45 is opened to the atmosphere, which increases a possibility that particles are contained in the pressure regulating fluid from the outside. For that reason, in the case where the ejection cartridge 100 applicable to the imprint apparatus 101 is accommodated, the configuration in which the ejection material and the working fluid are separated from each other is preferable. In addition, the coupler 19a and the coupler 19c have a structure that involves repetitive physical contact and friction, and thus particles can be produced from a friction portion. Also from this regard, the configuration in which the ejection material and the working fluid are separated from each other is preferable.

As shown in FIG. 4, the ejection cartridge 100 can be fixed to the mount 42. The mount 42 has a height that allows the difference Δh in liquid surface between the ejection head 7 and the pressure regulating fluid 44 to be implemented. This dispenses with an adjustment of a height of the pressure regulating fluid 44 every time the ejection cartridge 100 is contained. Note that it is sufficient as long as the difference Δh in liquid surface in the vertical direction between the ejection head 7 and the pressure regulating fluid 44 is implemented. For example, in the example shown in FIG. 4, the pressure regulating tank 45 is provided on a bottom surface of the storage device 41, but a separate mount on which the pressure regulating tank 45 is mounted may be provided. Also in this case, it is sufficient as long as the difference Δh in liquid surface in the vertical direction between the ejection head 7 and the pressure regulating fluid 44 is implemented.

As described above, the storage device 41 in the present embodiment includes the pressure regulating tank 45 that is opened to the atmosphere. The storage device 41 is configured such that the difference Δh in the vertical direction between the liquid surface of the pressure regulating fluid 44 in the pressure regulating tank 45 and surfaces of the ejection ports of the ejection head 7 of the ejection cartridge 100 is a predetermined height. This prevents the ejection material 2 from leaking out of the ejection ports 8 even in the case where the ejection cartridge 100 passes through a high altitude area or is airfreighted in a middle of its transportation.

Embodiment 2

In Embodiment 1, an aspect in which the inside of the accommodating container 1 is partitioned into the plurality of liquid chambers by flexible members (films) is described. In the present embodiment, an example in which an inside of an accommodating container 1 is not partitioned into a plurality of liquid chambers by a flexible member (film) but provided with a liquid chamber that is filled with ejection material 2 will be described.

Figure 6:
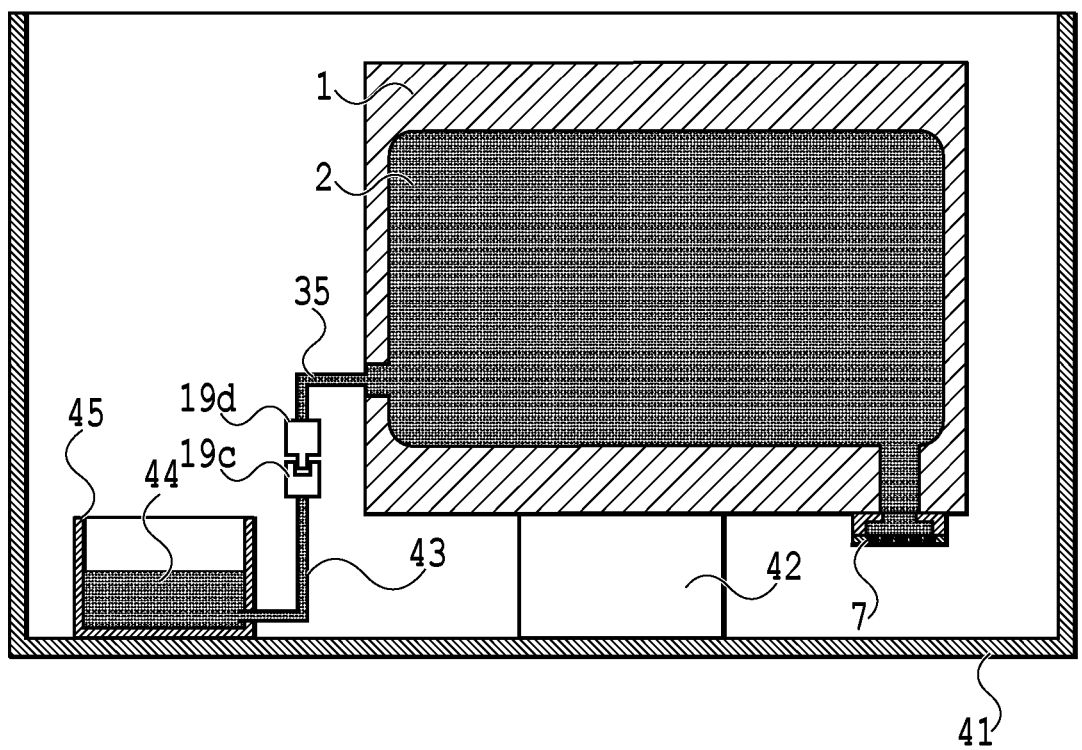
FIG. 6 is a diagram showing another configuration of the ejection cartridge.

FIG. 6 is a diagram used for describing the present embodiment. FIG. 6 is a diagram showing an aspect in which the inside of the accommodating container 1 is not partitioned into a plurality of liquid chambers by a flexible member. That is, FIG. 6 shows a case where pressure regulating fluid 44 in a pressure regulating tank 45 being a pressure controlling unit is the same material (liquid) as an ejection material to be ejected from an ejection head 7. The accommodating container 1 shown in FIG. 6 includes a pipe 35 that communicates with the liquid chamber accommodating the ejection material, and this pipe 35 is connected to a coupler 19d. By coupling the coupler 19d and a coupler 19c, the pressure regulating tank 45 and the inside of the accommodating container 1 communicate with each other.

Even in the aspect shown in FIG. 6, leakage of ejection materials 2 from ejection ports 8 can be prevented by a configuration in which the difference Δh in the vertical direction between the liquid surface of the pressure regulating fluid 44 in the pressure regulating tank 45 and surfaces of the ejection ports of the ejection head 7 of the ejection cartridge 100 is a predetermined height.

Embodiment 3

In Embodiment 2, the example in which the inside of the accommodating container 1 is not partitioned into a plurality of liquid chambers by a flexible member but provided with the liquid chamber that is filled with ejection material 2 is described. In the present embodiment, another aspect of the storage device, which stores the ejection cartridge 100 described in Embodiment 2.

Figure 7:
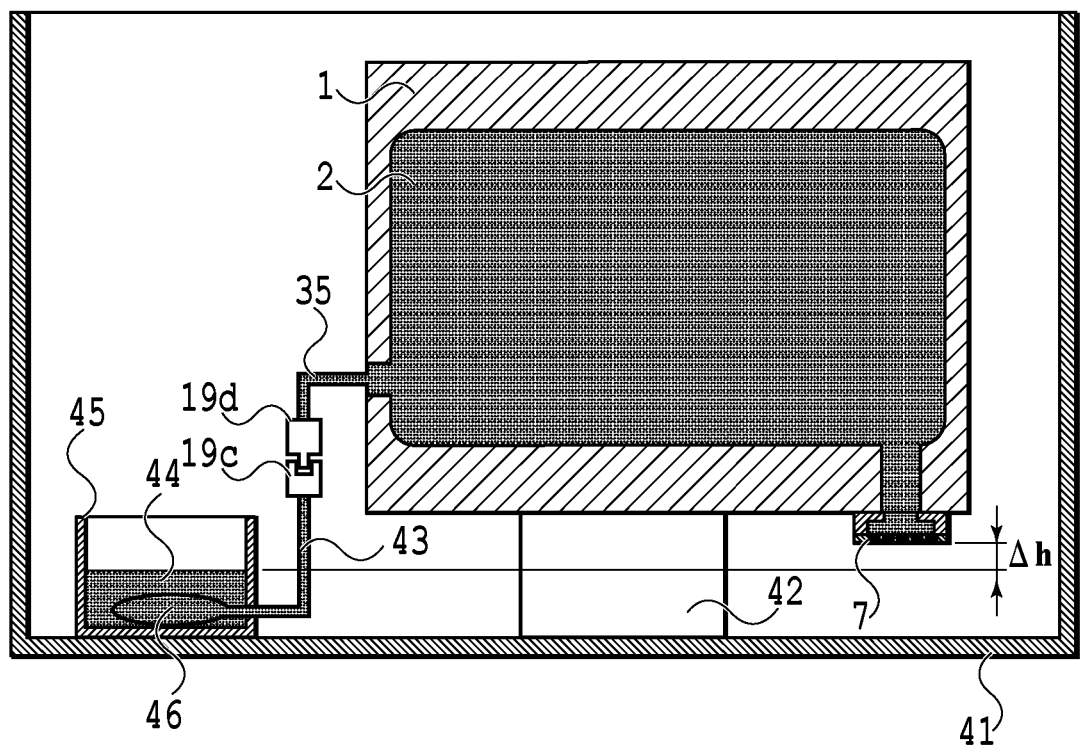
FIG. 7 is a diagram showing a storage device.

FIG. 7 is a diagram showing a storage device 41 in the present embodiment. The ejection cartridge 100 is formed such that an inside of an accommodating container 1 is not partitioned into a plurality of liquid chambers by a flexible film, as shown in FIG. 6 of Embodiment 2. In the storage device 41 shown in FIG. 7, a pressure regulating tank 45 being a pressure controlling unit is filled with pressure regulating fluid 44 up to a height that is lower than a position of an ejection head 7 by Δh. In the pressure regulating fluid 44 in the pressure regulating tank 45, a bag-shaped container 46 is immersed. The bag-shaped container 46 will be referred to also as a third container. The bag-shaped container 46 is a flexible film formed into an enclosed structure. The bag-shaped container 46 communicates with a connection pipe 43, and at a tip of the connection pipe 43, a coupler 19c is attached. Insides of the bag-shaped container 46 and the connection pipe 43 are filled with the ejection material 2 and can communicate with the ejection material 2 in the accommodating container 1 by connecting a coupler 19d and the coupler 19c.

In the present embodiment, in the above configuration with the ejection cartridge 100 attached, the ejection material 2 and pressure regulating fluid 44 are partitioned by a partition member that is formed by the bag-shaped container 46, as with the configuration shown in FIG. 4 of Embodiment 1. Therefore, even in a case where the pressure regulating fluid 44 is contaminated, a cleanliness of the ejection material 2 in the accommodating container 1 can be maintained.

Although the bag-shaped container 46 shown in FIG. 7 is described such that the bag-shaped container 46 is in a balloon shape, but the bag-shaped container 46 may be a flexible film that partitions an inside of the pressure regulating tank 45, as with the ejection-material-side film 4 and the working-fluid-side film 5 shown in FIG. 4. In addition, although Embodiment 3 is described as another embodiment of Embodiment 2, Embodiment 3 may be understood as another aspect of Embodiment 1. That is, Embodiment 3 may be an embodiment in which an inside of the bag-shaped container 46 in the pressure regulating tank 45 and an inside of the connection pipe 43 are filled with the working fluid 3, and the inside of the pressure regulating tank 45 is filled with the working fluid 3 or another kind of liquid. Alternatively, Embodiment 3 may be an embodiment in which the inside of the accommodating container 1 is partitioned into a plurality of liquid chambers by flexible members, as in Embodiment 1. In addition, Embodiment 3 may be an embodiment in which the inside of the bag-shaped container 46 in the pressure regulating tank 45 and the inside of the connection pipe 43 are filled with the ejection material 2, and a liquid chamber accommodating the ejection material 2 communicates with the bag-shaped container 46 and the connection pipe 43.

Embodiment 4

In Embodiment 4, another aspect of the storage device, which stores the ejection cartridge 100 described in Embodiment 1. An ejection cartridge 100 in the present embodiment includes a circulation mechanism that circulates ejection material in the accommodating container 1. The circulation mechanism produces a pulsating pressure. A storage device in the present embodiment includes a pressure controlling unit that drives and controls this circulation mechanism. An ejection device 10 in the present embodiment includes a control mechanism that drives and controls the circulation mechanism.

Figure 8A:
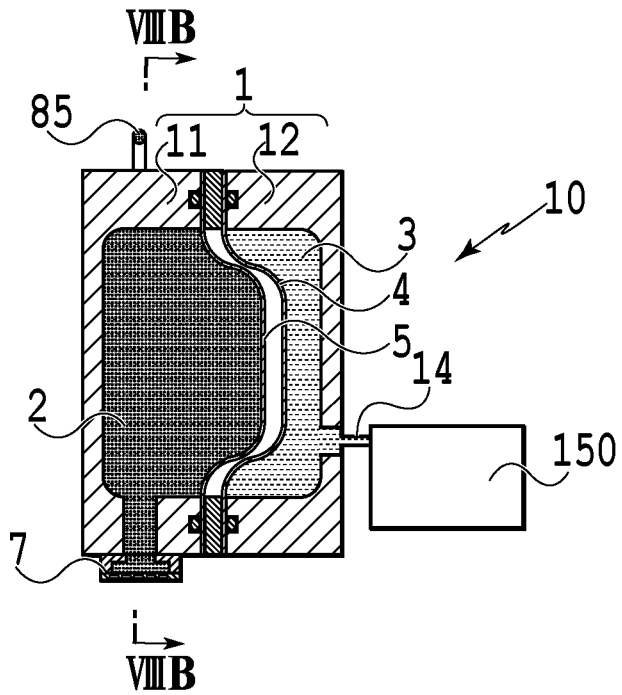
FIG. 8A and FIG. 8B are diagrams each showing an ejection device.
Figure 8B:
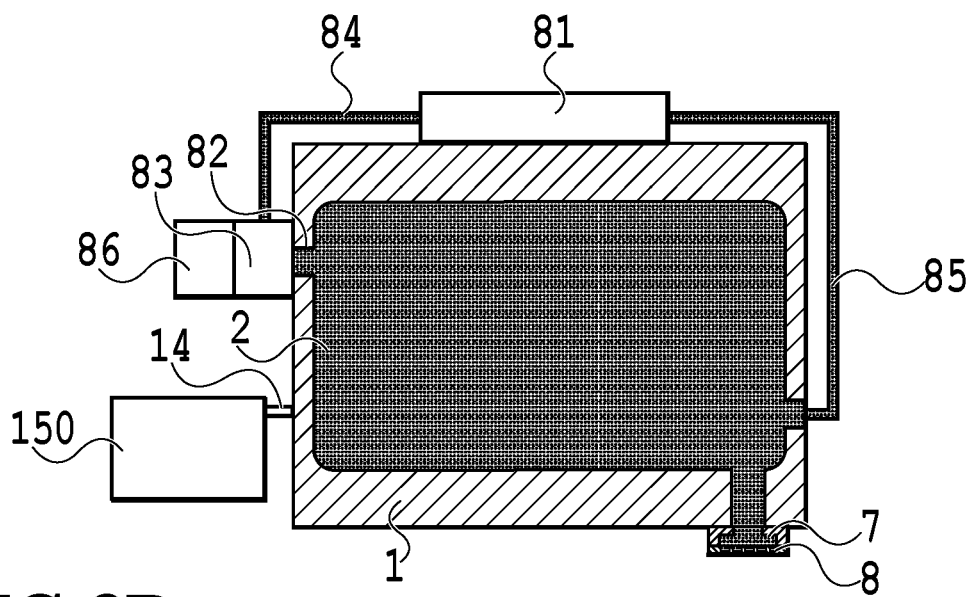

FIG. 8A and FIG. 8B are diagrams showing an example of the ejection device 10 in the present embodiment. The ejection device 10 shown in FIG. 8A has a configuration that is basically similar to the configuration described in Embodiment 1. FIG. 8B is a cross-sectional view taken along a line VIIIb-VIIIb of FIG. 8A. For ease of illustration, FIG. 8A and FIG. 8B are partially simplified diagrams of the configuration described in Embodiment 1, for example, showing only a connection pipe 14 as connection to a pressure control unit 150.

In an accommodating container 1 of the ejection cartridge 100, a first liquid chamber is filled with ejection material 2. To the first liquid chamber, a first circulation flow passage 82 is coupled in such a manner that the first circulation flow passage 82 communicates with the ejection material 2. To the first circulation flow passage 82, a circulating pump 83 is coupled. To the circulating pump 83, a second circulation flow passage 84 is coupled. To the second circulation flow passage 84, a filter 81 is coupled. To the filter 81, a third circulation flow passage 85 is coupled. The third circulation flow passage 85 is coupled to an inside of the accommodating container 1, communicating with the ejection material 2 in the accommodating container 1.

In addition, the ejection device 10 includes a first drive control unit 86 that is coupled to the circulating pump 83 and drives the circulating pump 83. The first drive control unit 86 drives the circulating pump 83, by which the ejection material 2 circulates through the accommodating container 1, the first circulation flow passage 82, the circulating pump 83, the second circulation flow passage 84, the filter 81, and the third circulation flow passage 85 in this order. As seen from the above, the circulating pump 83 is a liquid feeding unit that feeds the ejection material 2 to the circulation flow passages.

As mentioned above, in a semiconductor manufacturing process in which the photosensitive resist is used as an ejection material, if particles of a several-nm size are contained in, the ejection material is not applied on the substrate in a desired state. For that reason, the filter 81 is used to perform an operation of removing such particles. For the circulating pump 83 and the filter 81, those being resistant to the ejection material and not being prone to bring about metal elusion or to produce particles are to be used. For example, a mechanism of the circulating pump 83 is preferably of a diaphragm type, and the filter 81 is preferably made of polyethylene. The filter 81 may be formed by coupling two or more filters in conformity to particle specifications, and its filtering sizes may be in any combination such as 5 nm+20 nm. The first drive control unit 86 drives and controls the circulating pump 83 in such a manner that the pulsating pressure produced by the circulating pump 83 falls within a given range to an extent that the pulsating pressure does not cause the ejection material 2 to leak out of the ejection head 7. The given range is determined as appropriate in accordance with a kind of the ejection material 2, a diameter of the circulation flow passage, a type of the circulating pump 83, and the like.

Figure 9:
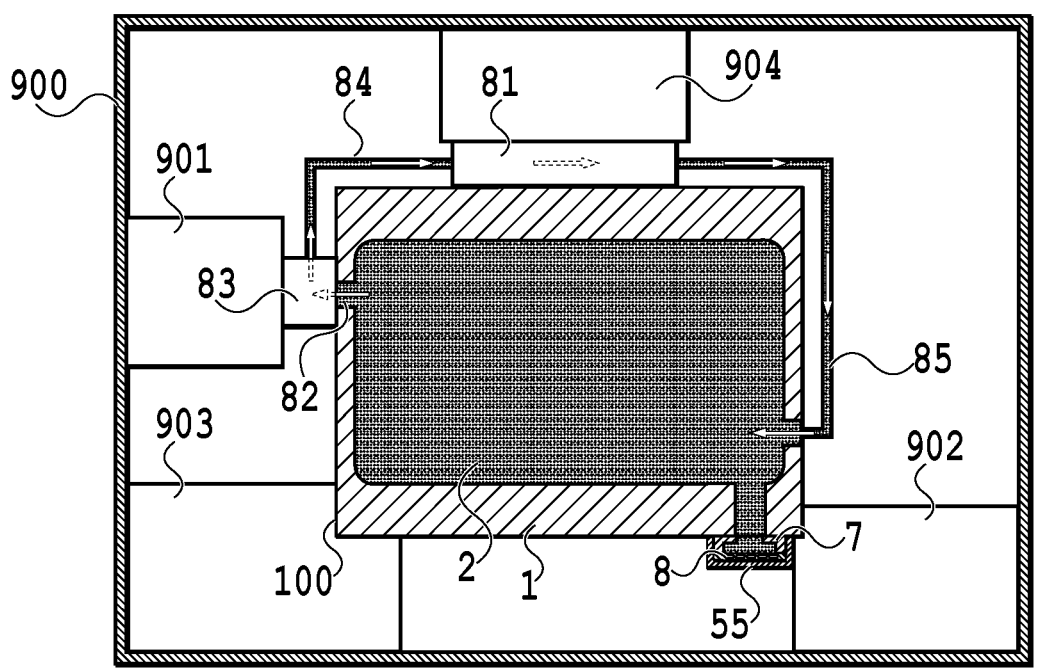
FIG. 9 is a diagram showing a storage device.

FIG. 9 is a diagram showing an example of a storage device 900 that accommodates the ejection cartridge 100 in the present embodiment. FIG. 9 shows a state where the ejection cartridge 100 detached from the ejection device 10 is accommodated in the storage device 900, or a state where the ejection cartridge 100 to be attached to the ejection device 10 is accommodated in the storage device 900. The storage device 900 is provided with a first fixing portion 902, a second fixing portion 903, and a third fixing portion 904 that fix the ejection cartridge 100. In addition, the storage device 900 is provided with a head cap 55 that makes it difficult for the ejection material 2 to leak out of the ejection ports 8 of the ejection head 7. Note that it is difficult for the head cap 55 alone to prevent the leakage of the ejection material 2 from the ejection head 7, as described in Embodiment 1.

The storage device 900 is provided with a second drive control unit 901 as a pressure controlling unit, to control operation of the circulating pump 83. In a case where the ejection cartridge 100 is accommodated in the storage device 900, the circulating pump 83 is coupled to the second drive control unit 901. The second drive control unit 901 may have a battery. By driving the circulating pump 83 using the second drive control unit 901, the ejection material 2 can be circulated and filtered in a direction of arrows shown in FIG. 9. Even in a case where the ejection material 2 deteriorates in storage to form gel and particles such as solid bodies, the gel and particles such as solid bodies can be removed with filter 81 by circulating and filtering the ejection material 2. The circulation and filtration can be performed all the time, but the filtration can be performed by intermittent operation in order to suppress consumption of the battery. If the pulsating pressure produced by the circulating pump 83 is excessively large, there is a possibility that the ejection material 2 leaks out of the ejection head 7. Hence, in the present embodiment, the second drive control unit 901 drives the circulating pump 83 in such a manner that the pulsating pressure produced by the circulating pump 83 falls within a given range within which the pulsating pressure does not cause the ejection material 2 to leak out of the ejection head 7.

In the present embodiment, the circulating pump 83 may be provided with a pressure sensing unit (pressure sensing sensor) that senses a pressure of the circulating ejection material. Alternatively, the pressure sensing unit may be provided in one of the circulation flow passages or the accommodating container 1 rather than in the circulating pump 83. With the pressure sensing unit provided, the pressure of the ejection material 2 during the operation of the circulating pump 83 can be sensed by the pressure sensing unit, allowing the pulsating pressure produced by driving the circulating pump 83 to be controlled to fall within the given range.

The storage device 900 may be provided with a temperature adjustment mechanism that adjusts a temperature of an inside of the storage device 900, for preventing a deterioration in quality of the ejection material 2 in the ejection cartridge 100. In addition, the storage device 900 may be provided with a pressure control mechanism that controls a pressure of the inside of the storage device 900 so as to prevent the leakage of the ejection material 2 due to expansion of air in the ejection cartridge 100 as described in Embodiment 1. That is, the storage device 900 may include a pressure regulating tank 45 as described in Embodiment 1.

As described above, according to the present embodiment, even in a case where the ejection material 2 deteriorates in storage to form gel and particles such as solid bodies, the gel and particles such as solid bodies can be removed with filter 81, and at the same time, the leakage of the ejection material 2 from the ejection head 7 can be prevented.

Embodiment 5

As the ejection cartridge 100 described in Embodiment 4 described above, an embodiment in which the ejection cartridge 100 is provided with the circulating pump 83, the filter 81, and the various circulation flow passages is described. The embodiment in which these components are accommodated in the storage device 900 is described. In the present embodiment, an embodiment in which a circulating pump, a filter, and circulation flow passages are provided on a storage device side will be described.

Figure 10A:
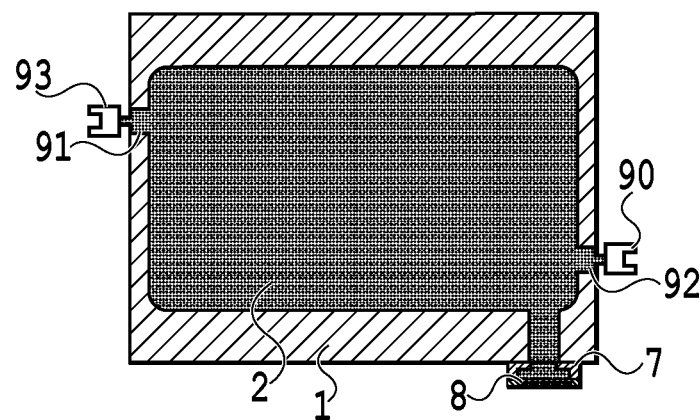
FIG. 10A and FIG. 10B are diagrams each showing how an ejection cartridge is accommodated in a storage device.
Figure 10B:
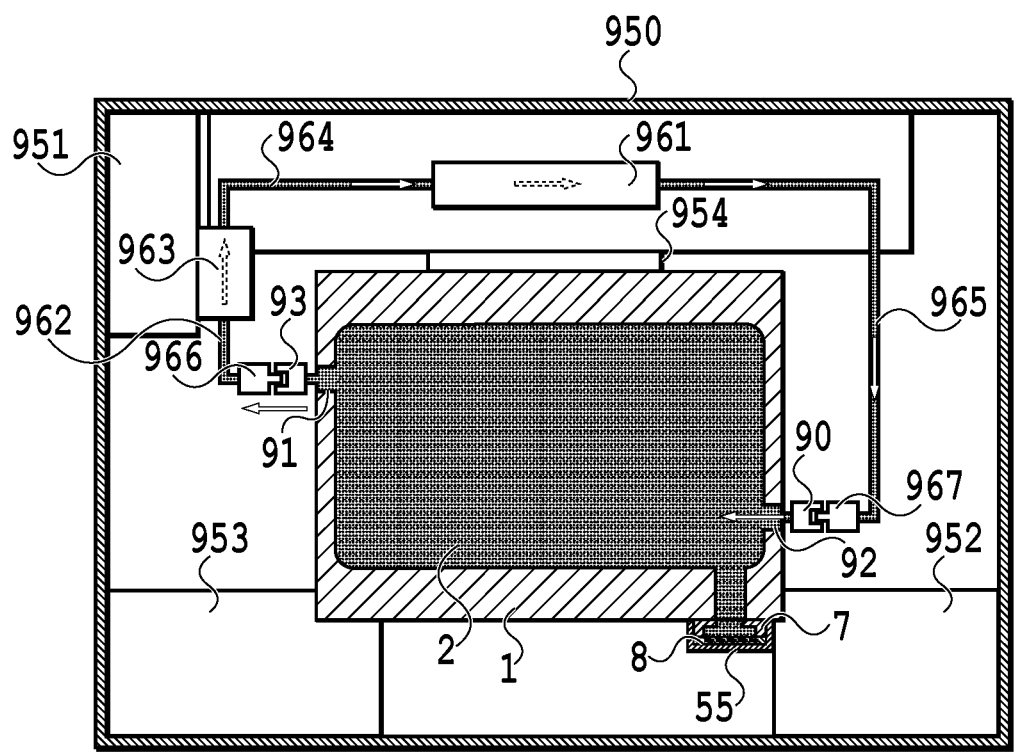

FIG. 10A and FIG. 10B are diagrams used for describing the present embodiment. FIG. 10A is a diagram showing an example of an ejection cartridge 100 that is to be attached to the ejection device 10 or has been detached from the ejection device 10. FIG. 10B shows a state where the ejection cartridge 100 shown in FIG. 10A is stored in a storage device 950 in the present embodiment.

As shown in FIG. 10B, in the present embodiment, the storage device 950 includes fixing portions 952 to 954. In addition, the storage device 950 includes a first circulation flow passage 962, a circulating pump 963, a second circulation flow passage 964, a filter 961, and a third circulation flow passage 965. The first circulation flow passage 962 is provided with a coupler 966. The third circulation flow passage 965 is provided with a coupler 967. The couplers are each configured in such a manner that the coupler communicates and allows liquid to flow in a case where the coupler is coupled and that a valve provided in the coupler is closed to prevent the ejection material 2 from leaking when the coupler is detached.

The ejection cartridge 100 is provided with a fourth circulation flow passage 91 and a fifth circulation flow passage 92. To the fourth circulation flow passage 91, a coupler 93 is connected, and to the fifth circulation flow passage 92, a coupler 90 is connected. As with the storage device 900 in Embodiment 4, the storage device 950 is provided with a third drive control unit 951 as a pressure controlling unit so as to control operation of the circulating pump 963, and the third drive control unit 951 is coupled to the circulating pump 963. The third drive control unit 951 may have a battery or may be supplied with electric power by being connected to an external electric power source.

In such a configuration, as in Embodiment 4, the third drive control unit 951 controls a pulsating pressure produced by the circulating pump 963 in such a manner that the pulsating pressure falls within a given range, so as to prevent the ejection material 2 from leaking out of the ejection head 7.

As described above in the present embodiment, it is possible to provide a configuration in which the components for circulating the ejection material are not provided in the ejection cartridge 100 but provided in the storage device 950. In this case, a size of the ejection cartridge 100 can be reduced. In addition, as described in the present embodiment, some of the components for the circulation can be provided in the storage device 950 by providing the couplers in a flow passage connection portion. It is also possible to provide a configuration in which ejection materials 2 in vicinities of ejection ports 8 are drawn up with a head cap 55 and circulated and filtered. Moreover, the present embodiment can be combined with any of the configurations described in Embodiments 1 to 3.

Embodiment 6

As described in Embodiment 1, the inside of the accommodating container 1 of the ejection cartridge 100 is provided with the inter-film gap 6 by the working-fluid-side film 5 and the ejection-material-side film 4 being flexible members. In a case where the ejection cartridge 100 having such a configuration is transported or stored, the ejection cartridge 100 can pass through a region at high sea level with a low atmospheric pressure or can be airfreighted to be exposed to a low-atmospheric-pressure environment. This regard has been described in Embodiment 1. In addition, during this transportation, vibration can be applied to the ejection cartridge 100, or an ambient temperature of the ejection cartridge 100 can significantly change relative to that when the ejection cartridge 100 is manufactured.

In such a case, if air enters into between the flexible members to widen a gap between the flexible members, the ejection material can leak out of the ejection head. If the gap between the flexible members is enclosed after the air enters the gap between the flexible members, and then the ambient temperature increases, or an ambient pressure decreases, the air between the flexible members expands, causing the ejection material to leak out of the head. It is conceivable to press a head cap against the ejection head, but, as mentioned above, the ejection head normally has a low rigidity. Therefore, if a pressing force against the head cap is excessively high, there is a possibility that the ejection head is broken.

In the present embodiment, an embodiment in which a pressure between the working-fluid-side film 5 and the ejection-material-side film 4 being the flexible members is controlled in a case where the ejection cartridge 100 is accommodated in the storage device will be described. The ejection cartridge 100 in the present embodiment is equivalent to that described in Embodiment 1.

Figure 11A:
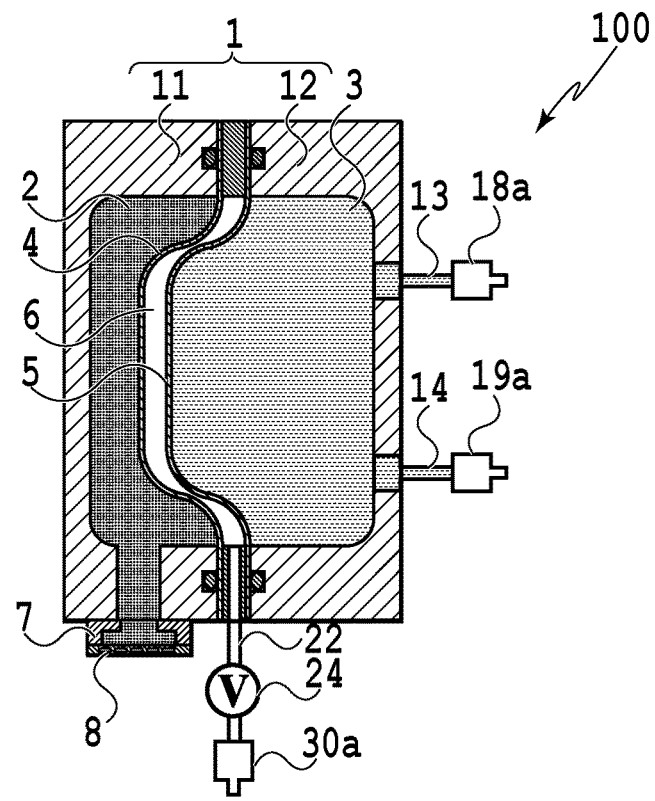
FIG. 11A and FIG. 11B are diagrams each showing how an ejection cartridge is accommodated in a storage device.
Figure 11B:
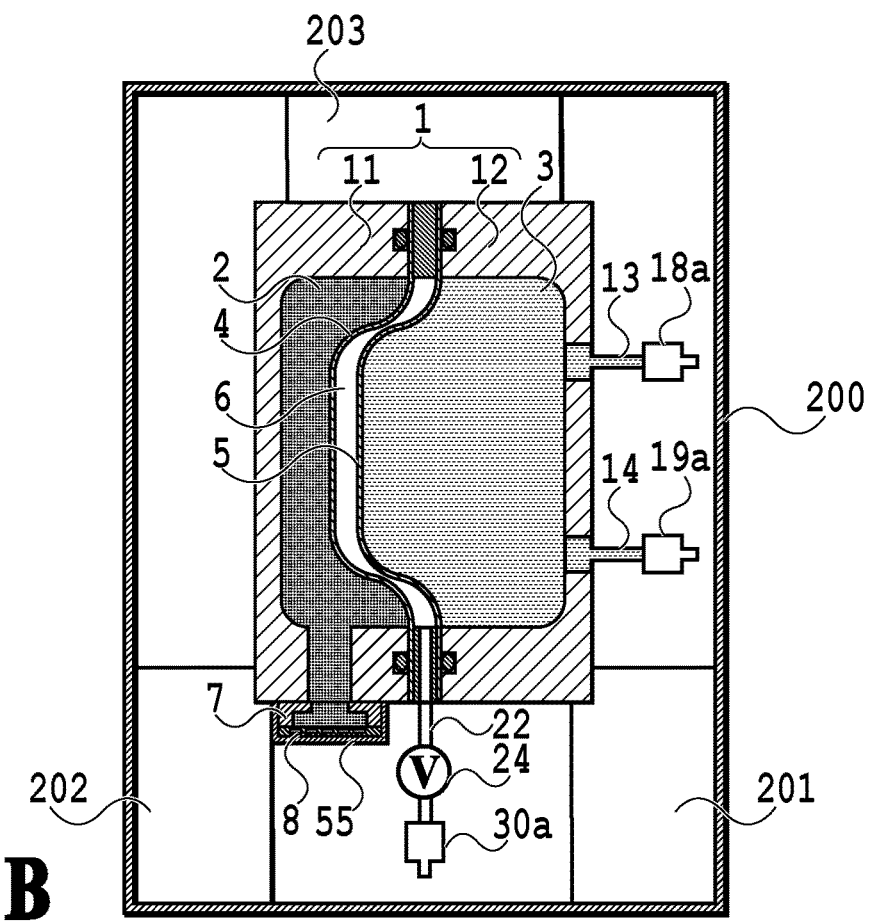

FIG. 11A shows a state where the ejection cartridge 100 has been detached from the ejection device 10 or a state before the ejection cartridge 100 is attached to the ejection device 10. FIG. 11B shows a state in which the ejection cartridge 100 is accommodated in a storage device 200. The storage device 200 includes fixing members 201 to 203. The ejection cartridge 100 is fixed to the storage device 200 by the fixing members 201 to 203. Fixing the ejection cartridge 100 with the fixing members 201 to 203 enables positions and postures of an accommodating container 1 and the ejection head 7 to be maintained stably while the ejection cartridge 100 is stored or transported, and enables to suppress vibration during the transportation.

The present embodiment will be described with attention paid to air inside an inter-film gap 6 provided between a working-fluid-side film 5 and an ejection-material-side film 4 in an accommodating container 1.

In a case where the ejection cartridge 100 is stored or transported, from a state shown in FIG. 2, the open-close valve 24 is closed, and then the coupler 30a and the coupler 30b are separated from each other, as described in Embodiment 1. Note that the couplers connected to the connection pipes 13 and 14 are also separate from each other, which will be however not described in the present embodiment. The coupler 30a is enclosed by an enclosing mechanism not shown.

Here, in a case where the coupler 30a is attached or detached, although its amount is small, air may enter into the inter-film-gap connection pipe 22. By separating the coupler 30a and the coupler 30b from each other after closing the open-close valve 24, air basically does not enter the inter-film gap 6. However, in a case where a tube made of a resin material is used for the inter-film-gap connection pipe 22, air gradually may penetrate into the tube from a wall surface and enter into the inter-film-gap connection pipe 22. In a case of a configuration in which the open-close valve 24 is not provided, a small amount of air may enter into the inter-film-gap connection pipe 22.

Originally, a pressure of the inter-film gap 6 is controlled to be a negative pressure that is not more than the pressure of the ejection material 2 and the working fluid 3 by a negative pressure generating unit 27 being a pressure controlling unit. However, during the storage or transportation, the entrance of the air can make the pressure of the inter-film gap 6 a positive pressure that is higher than the pressure of the ejection material 2 and the working fluid 3. If vibration is applied to the ejection cartridge 100, and additionally the air enters in such a state, there is a possibility that the ejection material 2 leaks out between the ejection head 7 and the head cap 55.

If the ambient temperature of the ejection cartridge 100 increases while the ejection cartridge 100 is stored or transported with the air entering into the inter-film gap 6, there is a possibility that a pressure of the air in the inter-film gap 6 increases, and the air expands, by which the ejection material 2 leaks out between the ejection head 7 and the head cap 55. In a case where the ejection cartridge 100 passes through a high altitude area or is airfreighted in a middle of its transportation, the ambient air pressure may become not more than 99.0 kPa. In a case where the ejection cartridge 100 is detached from a liquid ejection device in a place where an absolute pressure of its ambient air is 101.3 kPa at an ordinary level ground, the pressure of the air in the inter-film gap 6 is 101.3 kPa. In this case, the pressure of the air in the inter-film gap 6 is higher than the ambient air pressure 99.0 kPa by 2.3 kPa, and there is a possibility that the ejection material 2 leaks out between the ejection head 7 and the head cap 55.

In the present embodiment, with consideration given to the entrance of the air into the inter-film gap 6, an absolute value of the negative pressure contained inside of the inter-film gap 6 with respect to the pressure of the ejection material 2 and the working fluid 3 is set to be larger than a predetermined value before the ejection cartridge 100 is accommodated in the storage device 200 shown in FIG. 11B. For example, as described in Embodiment 1, the pressure of the ejection material 2 and the working fluid 3 in the accommodating container 1 is a pressure that is lower than the ambient air by 0.40±0.04 kPa, and in a case where an absolute pressure of the ambient air is 101.3 kPa, the pressure of the inside of the accommodating container 1 is 100.9 kPa (referred to as a first pressure). In the present embodiment, the negative pressure is generated in such a manner that the pressure of the inside of the inter-film gap 6 is lower than the first pressure (predetermined value), before the ejection cartridge 100 is accommodated in the storage device 200. In addition, the enclosing mechanism of the coupler 30a keeps the negative pressure. In such a manner, the pressure of the inside of the inter-film gap 6 is controlled.

As described above, according to the present embodiment, the leakage of the ejection material 2 in the ejection cartridge 100 can be suppressed in a case where the ejection cartridge 100 is stored or transported.

Embodiment 7

In Embodiment 6, the embodiment in which the leakage of the ejection material 2 in the ejection cartridge 100 is suppressed by containing the ejection cartridge 100 with the absolute value of the negative pressure of the inside of the inter-film gap 6 set to be larger than the value of the first pressure is described. In the present embodiment, an embodiment in which the storage device is provided with a pressure controlling unit that controls the pressure of the inter-film gap 6 will be described. More in detail, as the pressure controlling unit, a negative pressure generating unit (e.g., a pump) is provided.

Figure 12:
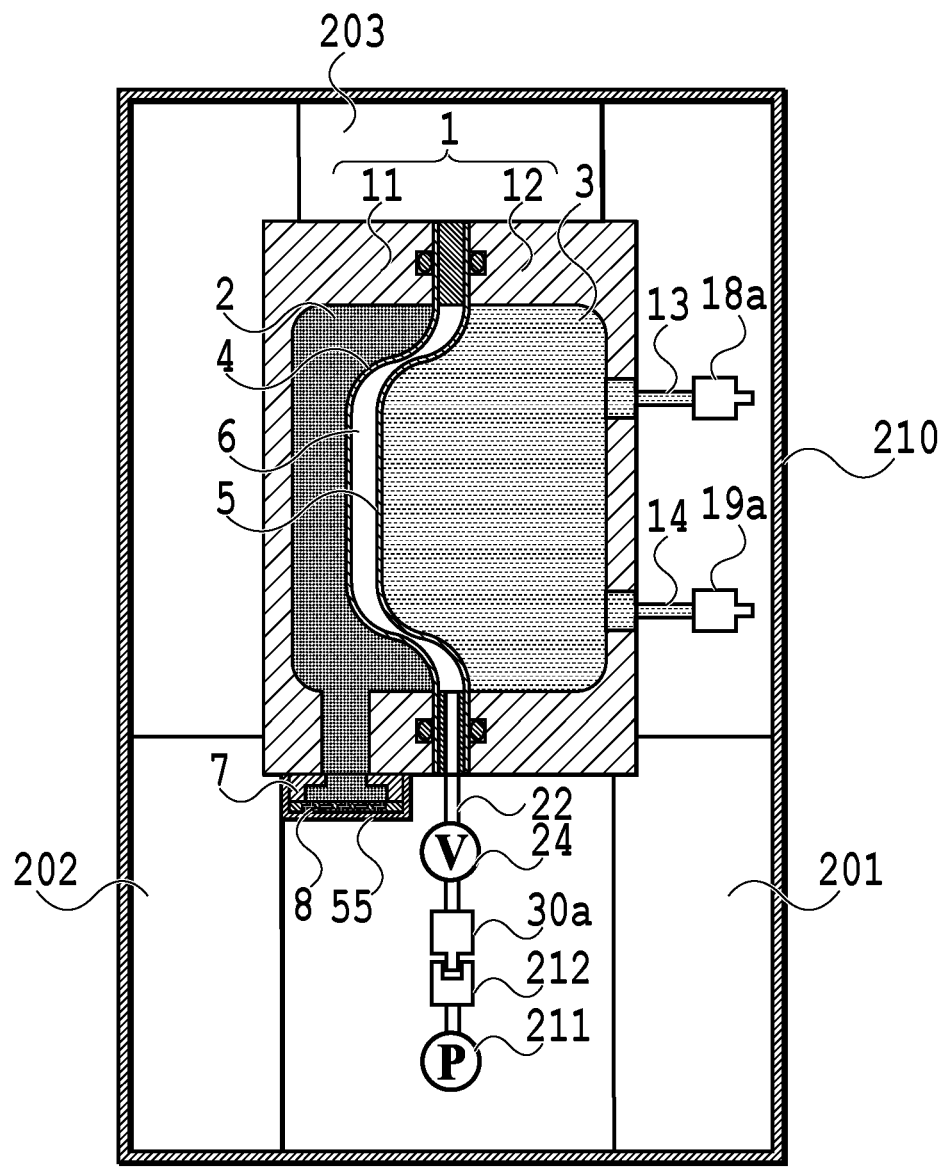
FIG. 12 is a diagram showing a storage device.

FIG. 12 is a diagram showing a storage device 210 in the present embodiment. In the present embodiment, the storage device 210 is provided with a negative pressure generating unit 211 that is equivalent to the negative pressure generating unit 27 provided in the ejection device 10 shown in FIG. 2. To the negative pressure generating unit 211, a coupler 212 is connected. By coupling the coupler 212 to a coupler 30a and generating a negative pressure with the negative pressure generating unit 211, the negative pressure can be generated in the inter-film gap 6. By the provision of the negative pressure generating unit 211 in the storage device 210 in such a manner, a pressure of an inside of the inter-film gap 6 can be controlled, so that the leakage of the ejection material 2 in the ejection cartridge 100 can be prevented.

Note that the negative pressure generating unit 211 need not operate all the time and may operate intermittently. The negative pressure generating unit 211 may include a pressure sensing unit (not shown) that senses the pressure of the inside of the inter-film gap 6. A proper threshold range of the pressure of the inside of the inter-film gap 6 may be set, and the negative pressure generating unit 211 may include a mechanism that causes, in a case where a value of the pressure of the inside of the inter-film gap 6 sensed by the pressure sensing unit falls out of the threshold range, the negative pressure generating unit 211 to operate and perform control such that the pressure of the inside of the inter-film gap 6 falls within the threshold range.

Embodiments 6 and 7 may be combined. For example, as described in Embodiment 6, in a case where the ejection cartridge 100 is detached from the ejection device 10, the ejection cartridge 100 may be contained in the storage device 210 in the present embodiment with the absolute value of the negative pressure of the inter-film gap 6 set to be larger than the predetermined value. In a case where the ejection cartridge 100 is detached, the inter-film gap 6 is sealed by closing the enclosing mechanism of the coupler 30a or the open-close valve 24. In such a manner, the leakage of the ejection material 2 can be prevented during a period from the detachment from the ejection device 10 to the attachment to the storage device 210.

Embodiment 8

In Embodiment 7, the embodiment in which the negative pressure generating unit is provided in the storage device as the pressure controlling unit that controls the pressure of the inter-film gap 6 is described. In the present embodiment, an embodiment in which a vacuum keeping unit is provided as a pressure controlling unit will be described.

Figure 13:
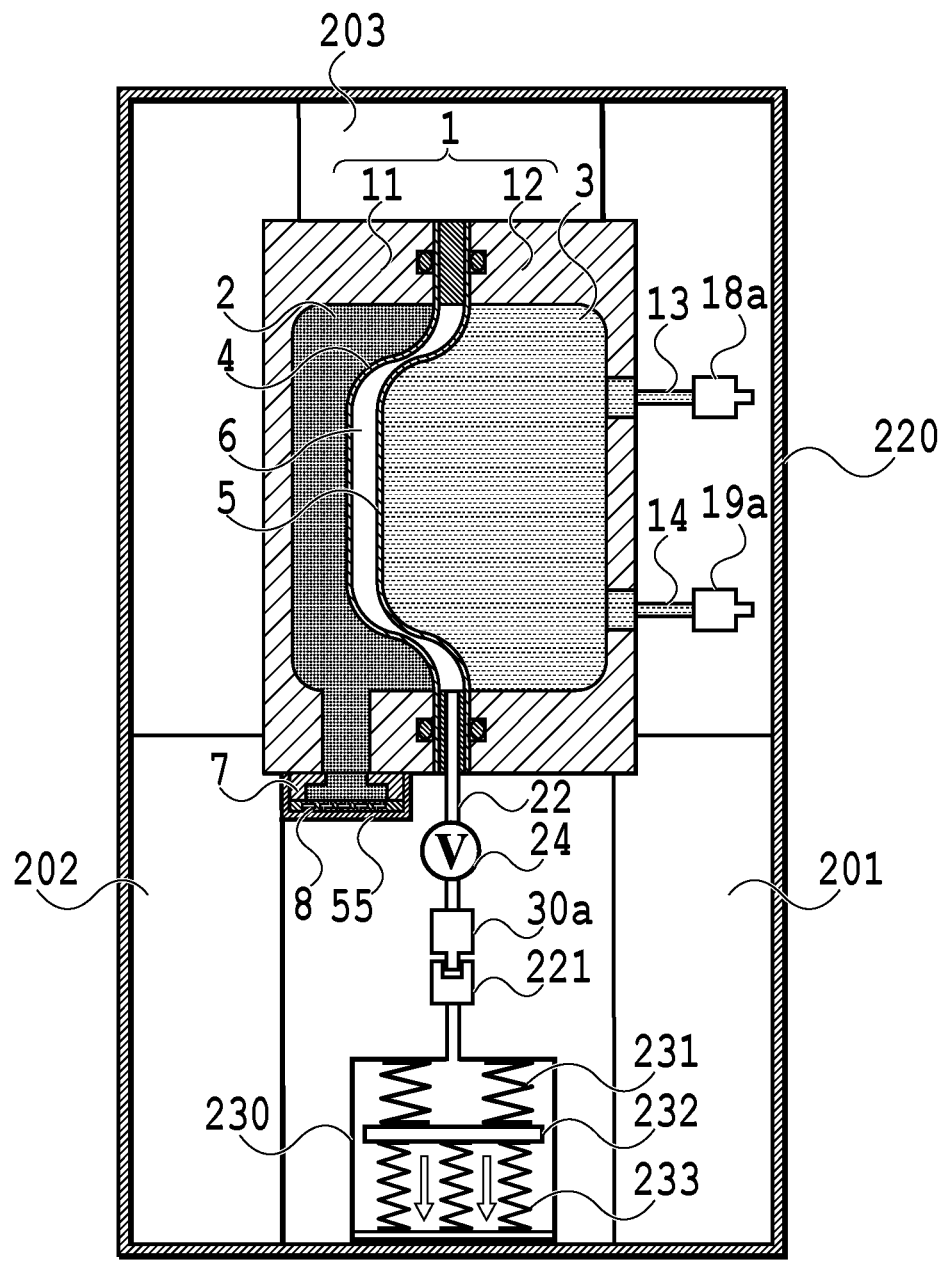
FIG. 13 is a diagram showing a storage device.

FIG. 13 is a diagram showing a storage device 220 in the present embodiment. FIG. 13 shows a vacuum keeping unit 230 that is provided in place of the negative pressure generating unit 211 of the storage device 210 shown in FIG. 12. The vacuum keeping unit 230 includes a bending member 231, a bending portion fixing member 232, and a spring member 233.

In FIG. 13, an inter-film-gap connection pipe 22 communicates with the bending member 231. An end portion of the bending member 231 is fixed to the bending portion fixing member 232. The inter-film-gap connection pipe 22, the bending member 231, and the bending portion fixing member 232 are joined together with no gaps, forming a closed space together with an inter-film gap 6. To the bending portion fixing member 232, the spring member 233 is attached. The spring member 233 is attached on a predetermined face of the vacuum keeping unit 230. The spring member 233 pulls the bending portion fixing member 232 in a direction toward the predetermined face of the vacuum keeping unit 230 (downward direction in FIG. 13) and thus applies force to the bending member 231 in a direction in which the bending member 231 expands. This can produce the negative pressure of the inter-film gap 6.

In addition, if the pressure of the inter-film gap 6 decreases, the spring member 233 applies a force that pushes the bending portion fixing member 232 in an upward direction in FIG. 13, and thus the bending member 231 receives a force that contracts the bending member 231. This can maintain the pressure of the inter-film gap 6. Note that the bending member 231 may be changed to a spring member. In this case, if the pressure of the inter-film gap 6 fluctuates between a positive pressure and a negative pressure, equilibrium brought by force of a spring fixed to both ends of a fixing member of the spring member enables the fluctuation in the pressure to be adjusted (managed). As a result, the leakage of the ejection material 2 in the ejection cartridge 100 can be prevented.

In the present embodiment, by joining the inter-film-gap connection pipe 22, the bending member 231, and the bending portion fixing member 232 together with no gaps, the closed space together with an inter-film gap 6 is formed. Here, instead of using the bending member 231 and the bending portion fixing member 232, the inter-film-gap connection pipe 22 may be connected to a vacuum container not shown. The vacuum container may include a pipe connectable to a vacuum pumping device, and a valve. With the vacuum container connected to the inter-film-gap connection pipe 22 in advance, the vacuum container may be evacuated and then sealed with the valve. This can maintain the negative pressure of the inter-film gap 6 for a long time.

Note that the configurations described in Embodiments 6 to 8 may be combined with any of the embodiments described in Embodiments 1 to 3, or may be combined with the embodiment described in Embodiment 4 or 5. In addition, any one of the embodiments of Embodiments 1 to 3, the embodiment of Embodiment 4 or 5, and any one of the embodiments of Embodiments 6 to 8 may be combined. In a case where the ejection cartridge 100 is accommodated in a storage device for storage or transportation, an embodiment in which a plurality of configurations capable of preventing the leakage of the ejection material 2 are provided may be adopted.

Embodiment 9

In Embodiments 1 to 8, the configurations of the storage devices for accommodating the ejection cartridge 100 are described. In the present embodiment, a configuration for preventing the leakage of the ejection material 2 in the ejection device 10 will be described.

Figure 14:
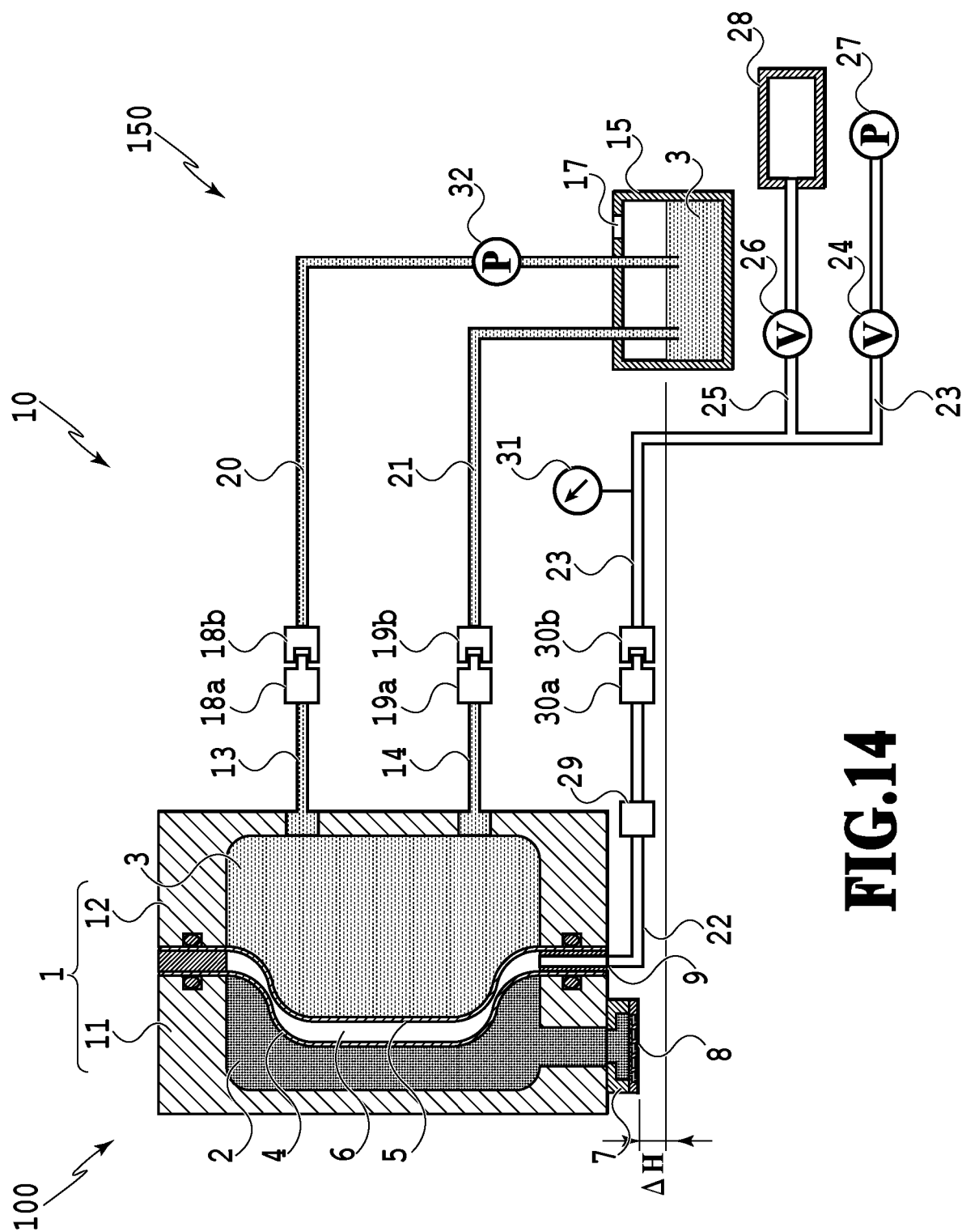
FIG. 14 is a diagram showing an ejection device.

FIG. 14 is a diagram showing an example of a configuration of an ejection device 10 in the present embodiment. Basically, the ejection device 10 has a configuration similar to the configuration described with reference to FIG. 2 in Embodiment 1, and further has a configuration that is neither described nor shown in FIG. 2.

To an inter-film-gap connection pipe 22 that communicates with an inter-film gap 6 of the ejection device, a negative pressure generating unit 27 being a pressure controlling unit is connected via a communicating pipe 23 (first pipe) in such a manner that the negative pressure generating unit 27 can communicate with the inter-film-gap connection pipe 22. To the communicating pipe 23, an open-close valve 24 (first valve) is connected. To the inter-film-gap connection pipe 22, a vacuum keeping unit 28 being a pressure controlling unit is additionally connected. The inter-film-gap connection pipe 22 and the vacuum keeping unit 28 are connected to each other via a communicating pipe 25 (second pipe). In a middle of the communicating pipe 25, an open-close valve 26 (second valve) is connected. The inter-film-gap connection pipe 22 and the communicating pipe 25 are also separable from each other by a coupler 30a and a coupler 30b. A pressure of the inter-film gap 6 is monitored by a pressure sensor 31 present in a middle of a pipe connecting the inter-film-gap connection pipe 22 to the negative pressure generating unit 27 and the vacuum keeping unit 28, and is controlled to be a negative pressure that is not more than a pressure of ejection material 2 and working fluid 3.

For the vacuum keeping unit 28, a configuration that includes a vacuum tank, a vacuum accumulator, or a vacuum container having a container volume that is, for example, more than five times in volume ratio as high as an inner volume of the inter-film gap 6 and an inside of a flow passage of the pipe connecting the vacuum keeping unit 28 and the inter-film gap 6, and the vacuum tank, the vacuum accumulator, or the vacuum container is bonded to a spring, of which force maintains a degree of vacuum is used.

The negative pressure generating unit 27 and the vacuum keeping unit 28 both need not operate all the time to maintain the negative pressure of the inter-film gap 6, and the maintenance of the negative pressure may be achieved by one of the negative pressure generating unit 27 and the vacuum keeping unit 28 as long as a desired negative pressure can be maintained.

In general, it is often a case with industrial equipment such as semiconductor manufacturing equipment that electric power supply and a supply in a compressed air line are stopped in a case of occurrence of earthquake or detection of an abnormal event in the equipment. In addition, also in a case where an abnormal event occurs in a supplier for facilities, electric power source, gas, cooling water, compressed air, exhaust air, and the like supplied to the equipment are stopped. In such a case, the pressure of the inter-film gap 6 (negative pressure) cannot be maintained, which arises a possibility that the inter-film gap 6 opens to cause the ejection material to leak from the ejection head 7.

Hence, in the present embodiment, for example, the negative pressure generating unit 27 may be caused to generate the negative pressure as needed at normal times, and the vacuum keeping unit 28 may be caused to functions in a case where the ejection device 10 and the facilities stop. That is, in a case where controlling the pressure by the negative pressure generating unit 27 is difficult due to the stop of the ejection device 10 and the facilities, the inter-film gap 6 and the vacuum keeping unit 28 can be made to communicate with each other by closing the open-close valve 24 and opening the open-close valve 26. The vacuum keeping unit 28 can maintain the pressure of the inter-film gap 6. Note that, in a case where such control is performed, a normally closed valve is preferably used as the open-close valve 24, and a normally opened valve is preferably used as the open-close valve 26. This causes the inter-film gap 6 to communicate with only the vacuum keeping unit 28 even when the electric power supply or the compressed air supply becomes impossible.

Note that, in place of the open-close valve 24 and the open-close valve 26, a valve (third valve) that is capable of switching a pipe to be connected to the inter-film-gap connection pipe 22 to one of the communicating pipe 23 and the communicating pipe 25, or to both of the communicating pipe 23 and the communicating pipe 25. In a case where a drive valve is used as the valve, open-close control of the valve is performed by the control unit 16.

Next, an operation of the ejection device 10 in a case where an ejection cartridge 100 is replaced, and a new ejection cartridge 100 is attached, in particular, an operation relating to a configuration for connecting to the inter-film-gap connection pipe 22 will be described.

The ejection cartridge 100 is configured to be replaced on a per ejection cartridge 100 basis, in a case where the ejection material 2 is consumed, or in a case where an ejection mechanism unit of the ejection head 7 reaches its lifetime to become no longer able to satisfy a desired ejection performance. In a case where a new ejection cartridge 100 is attached, connecting the coupler 30a to the coupler 30b causes insides of the inter-film-gap connection pipe 22, the communicating pipe 23, and the communicating pipe 25 to communicate with one another. The configuration is such that, at that time, the open-close valve 24 is opened, and the open-close valve 26 is closed. That is, the inter-film gap 6 communicates with the negative pressure generating unit 27 but does not communicate with the vacuum keeping unit 28. This is to prevent unnecessary objects are contained in an inside of the vacuum keeping unit 28 in a case where the ejection cartridge 100 is attached. With the inter-film gap 6 communicating with the negative pressure generating unit 27, the pressure sensor 31 monitors the pressure, and the pressure is controlled by the negative pressure generating unit 27 so as to be a desired pressure.

Thereafter, the open-close valve 26 is opened to cause the inter-film gap 6 and the vacuum keeping unit 28 to communicate with each other. Causing the vacuum keeping unit 28 to communicate with the inter-film gap 6 can not only maintain the vacuum of the inter-film gap 6 in a case where the electric power supply or the compressed air supply becomes impossible, but also serves as a damper that damps the fluctuation in pressure caused by the negative pressure generating unit 27. Note that, as previously described, the negative pressure generating unit 27 and the vacuum keeping unit 28 both need not operate all the time, and the maintenance of the negative pressure may be achieved by one of the negative pressure generating unit 27 and the vacuum keeping unit 28 as long as a desired negative pressure can be maintained.

Embodiment 10

In Embodiment 9, the negative pressure generating unit 27 and the vacuum keeping unit 28 that communicate with the inter-film-gap connection pipe 22 in the ejection device 10 by the connection of the coupler 30a and the coupler 30b are described. In the present embodiment, an embodiment in which a vacuum keeping unit being a pressure controlling unit is provided on an ejection cartridge 100 side will be described. That is, an embodiment in which, in a case where an ejection cartridge 100 is detached, the ejection cartridge 100 can be stored or transported with the vacuum keeping unit communicating with the ejection cartridge 100 will be described.

Figure 15:
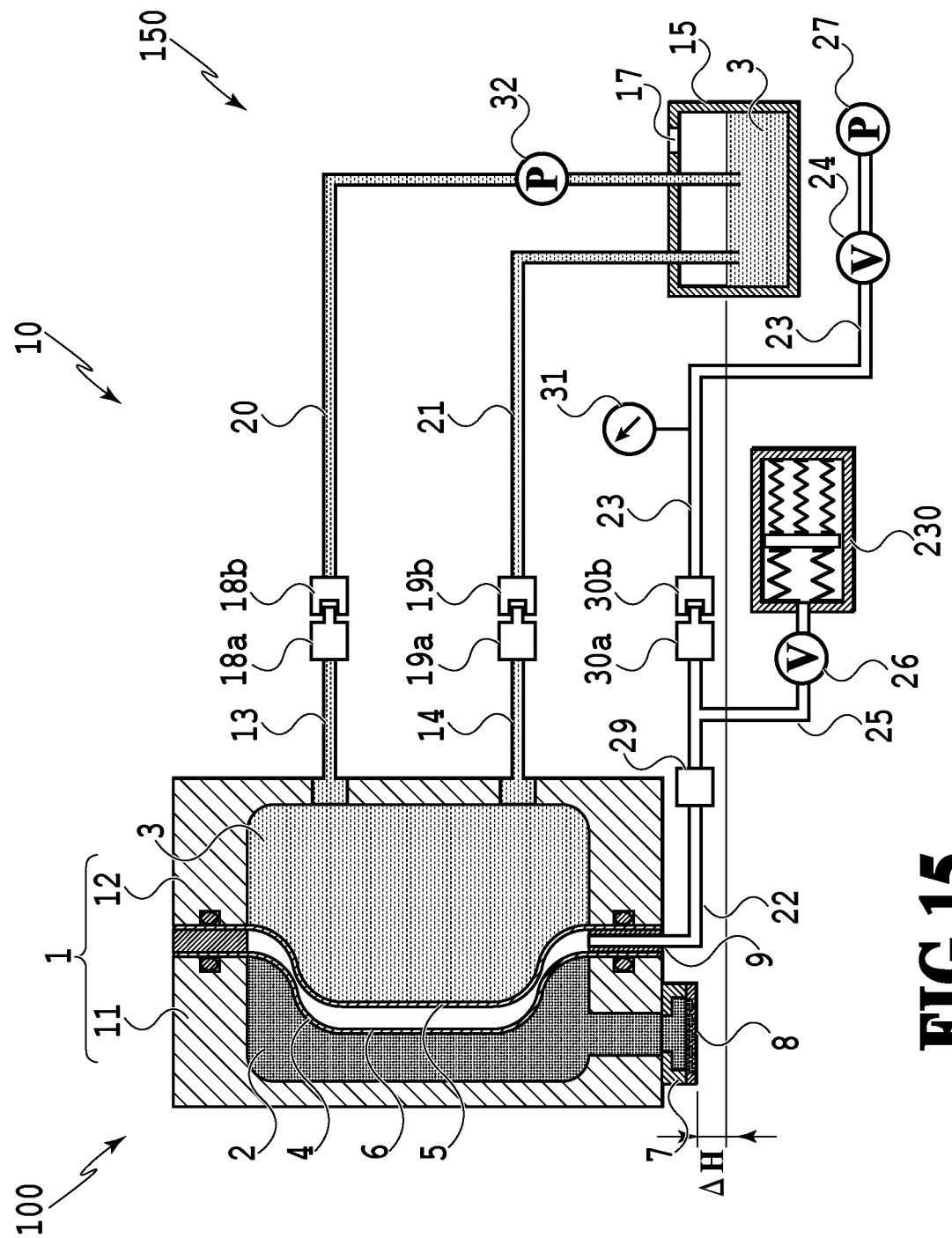
FIG. 15 is a diagram showing an ejection device.

FIG. 15 is a diagram showing an example of an ejection device 10 in the present embodiment. A communicating pipe 25 is connected in a middle of a pipe flow passage between an inter-film-gap connection pipe 22 of the ejection cartridge 100 and a coupler 30a and is configured to connect the inter-film gap 6 and the vacuum keeping unit 230. A vacuum keeping unit 230 in the present embodiment is assumed to be the same as the vacuum keeping unit 230 described in Embodiment 8.

Figure 16:
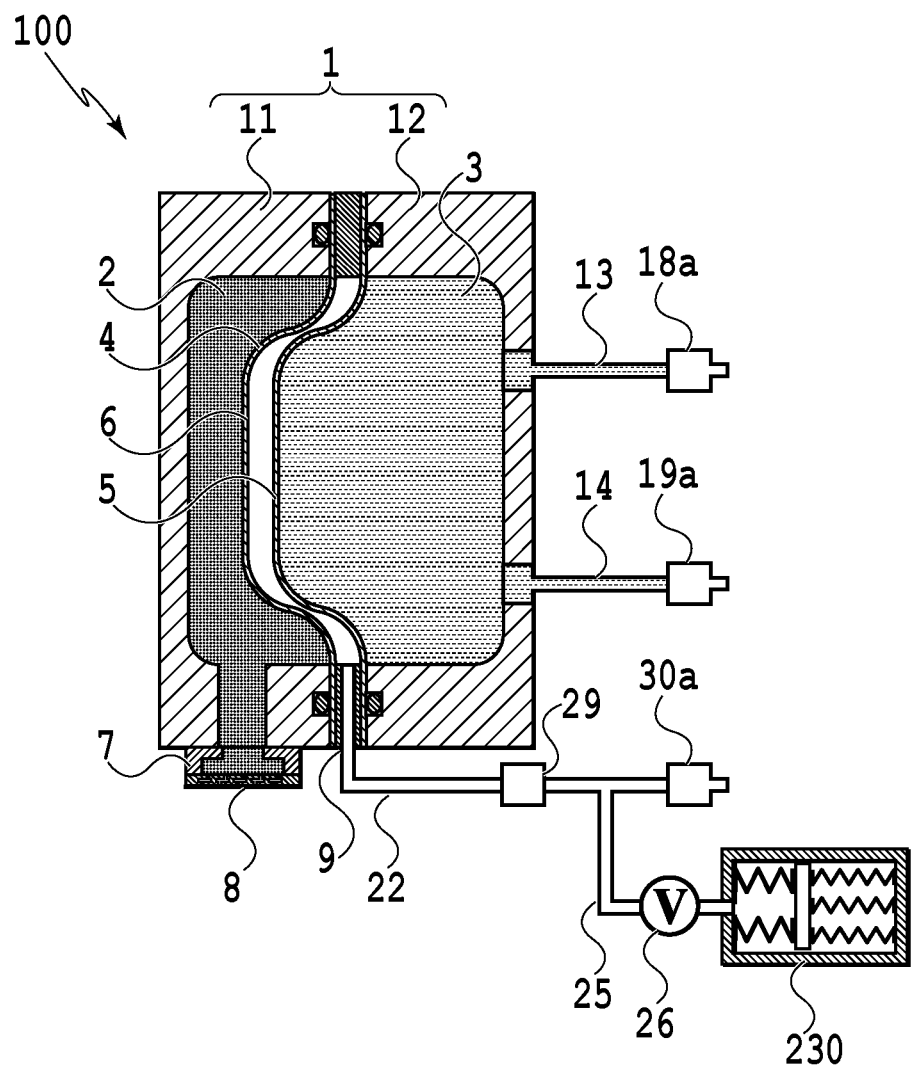
FIG. 16 is a diagram showing an ejection cartridge.

FIG. 16 is a diagram showing the state shown in FIG. 15 from which the coupler 30a and a coupler 30b are separated from each other, couplers 18a and 18b are separated from each other, and couplers 19a and 19b are separated from each other. In this state, the ejection cartridge 100 can be contained in a not-shown storage device for storage or transportation. In the ejection cartridge 100, an inter-film-gap connection pipe 22 communicating with the inter-film gap 6 is connected to the coupler 30a in a sealed state and to the vacuum keeping unit 230 via the communicating pipe 25. Therefore, even in a case where an atmospheric pressure of insides of the inter-film gap 6 and a pipe connected to the inter-film gap 6 fluctuates until the ejection cartridge 100 is stored in the storage device, while the ejection cartridge 100 is stored in the storage device, and while the ejection cartridge 100 is transported, a degree of vacuum can be maintained by the vacuum keeping unit 230. The leakage of the ejection material 2 in the accommodating container 1 from the ejection head 7 can be thereby prevented.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-083710, filed Apr. 25, 2019, which is hereby incorporated by reference wherein in its entirety.

What is claimed is:

1. A storage device that stores an ejection cartridge including an accommodating container that accommodates an ejection material, and an ejection head that includes an ejection port for ejecting the ejection material accommodated in the accommodating container, the storage device comprising:
   a fixing portion configured to fix the ejection cartridge; and
   a pressure controlling unit configured to control a pressure of an inside of the accommodating container of the ejection cartridge fixed to the fixing portion with the ejection port not enclosed,
   wherein:
   the accommodating container is partitioned into a first liquid chamber and a second liquid chamber by a plurality of flexible partition members, the first liquid chamber communicating with the ejection head and being configured to accommodate the ejection material, and the second liquid chamber not communicating with the ejection head and being configured to accommodate a liquid; and
   the pressure controlling unit includes a keeping unit configured to keep a pressure of a gap between the flexible partition members at a negative pressure that is not more than a pressure of the first liquid chamber and the second liquid chamber.

2. The storage device according to claim 1, further comprising:
   a pipe connectable to a communication portion that communicates with the inside of the accommodating container; and
   a second accommodating container that communicates with the pipe and is filled with liquid,
   wherein a surface of the liquid in the second accommodating container is at a position in a vertical direction lower than an ejection surface on which the ejection port of the ejection cartridge fixed to the fixing portion is arranged.

3. The storage device according to claim 2, wherein the second accommodating container is opened to an atmosphere.

4. The storage device according to claim 2, wherein the pipe communicates with the second liquid chamber in the accommodating container.

5. The storage device according to claim 2, wherein the second accommodating container includes a third container that has flexibility and is immersed in the liquid with which an inside of the second accommodating container is filled, and
   wherein the pipe communicates with the third container to form an enclosed space between the inside of the accommodating container and the third container.

6. The storage device according to claim 1, wherein the ejection cartridge includes:
   a circulation flow passage that communicates with the first liquid chamber;
   a liquid feeding unit configured to feeds the ejection material in the first liquid chamber to the circulation flow passage; and
   a filter provided in the circulation flow passage,
   wherein the storage device further includes a drive control unit configured to drive and control the liquid feeding unit, and
   wherein the drive control unit controls a pulsating pressure of the liquid feeding unit in such a manner that the pulsating pressure falls within a given range.

7. The storage device according to claim 1, further comprising:
   a circulation flow passage connectable to a communication portion that communicates with the first liquid chamber;
   a liquid feeding unit configured to feeds the ejection material in the first liquid chamber to the circulation flow passage;
   a filter provided in the circulation flow passage; and
   a drive control unit configured to drive and control the liquid feeding unit,
   wherein the drive control unit controls a pulsating pressure of the liquid feeding unit in such a manner that the pulsating pressure falls within a given range.

8. The storage device according to claim 6, wherein the drive control unit causes the liquid feeding unit to perform an intermittent operation.

9. The storage device according to claim 6, further comprising a sensing unit configured to sense a pressure of the ejection material that is fed by the liquid feeding unit,
   wherein the drive control unit performs control such that the sensed pressure falls within the given range.

10. The storage device according to claim 1, wherein the keeping unit includes a negative pressure generating unit configured to make the pressure of the gap between the flexible partition members a negative pressure, and causes the negative pressure generating unit to generate the negative pressure, so as to keep the pressure of the gap between the flexible partition members at the negative pressure that is not more than the pressure of the first liquid chamber and the second liquid chamber.

11. The storage device according to claim 10, wherein the keeping unit causes the negative pressure generating unit to perform an intermittent operation.

12. The storage device according to claim 10, wherein the keeping unit includes a sensing unit configured to sense the pressure of the gap between the flexible partition members, and causes the negative pressure generating unit to adjust the negative pressure in a case where a value of sensing by the sensing unit falls out of a threshold range.

13. The storage device according to claim 1, wherein the keeping unit corresponds to a sealing unit configured seal the gap between the flexible partition members, after air in the gap between the flexible partition members has been evacuated.

14. The storage device according to claim 1, wherein the keeping unit includes:
    a vacuum container connected to a flow passage of the gap between the flexible partition members; and
    a sealing unit configured to seal the vacuum container, after air in the vacuum container and the gap between the flexible partition members has been evacuated.

15. The storage device according to claim 1, wherein the keeping unit corresponds to a vacuum container that includes a spring connected to a flow passage between flexible partition members, and keeps spaces of the vacuum container and the gap between the flexible partition members at a negative pressure.

16. The storage device according to claim 1, wherein the ejection material is a resist used in imprint processing.

\* \* \* \* \*